US012633763B2

(12) United States Patent (10) Patent No.: US 12,633,763 B2
Huang (45) Date of Patent: May 19, 2026

(54) MULTI-BATTERY MANAGEMENT FOR A PORTABLE DEVICE

(71) Applicant: Techtronic Cordless GP, Anderson, SC (US)

(72) Inventor: Jinglei Huang, Dongguan City (CN)

(73) Assignee: TECHTRONIC CORDLESS GP, Anderson, SC (US)

( * ) Notice: Subject to any disclaimer, the term of this patent is extended or adjusted under 35 U.S.C. 154(b) by 827 days.

(21) Appl. No.: 17/913,341

(22) PCT Filed: Mar. 23, 2020

(86) PCT No.: PCT/CN2020/080570

§ 371 (c)(1),
(2) Date: Sep. 21, 2022

(87) PCT Pub. No.: WO2021/189176

PCT Pub. Date: Sep. 30, 2021

(65) Prior Publication Data

US 2023/0147651 A1 May 11, 2023

(51) Int. Cl.
H02J 7/56 (2026.01)
H01M 50/512 (2021.01)
(Continued)

(52) U.S. Cl.
CPC ............. H02J 7/56 (2026.01); H01M 50/512 (2021.01); H02J 7/82 (2026.01); H02J 7/855 (2026.01);
(Continued)

(58) Field of Classification Search
CPC ...... H02J 7/0019; H02J 7/0048; H02J 7/0063; H02J 7/00714; H02J 7/007182; H01M 50/512
(Continued)

(56) References Cited

U.S. PATENT DOCUMENTS 4,025,860 A * 5/1977 Shibata ................... B60L 58/21
320/DIG. 34
6,229,279 B1 * 5/2001 Dierker ................. H02J 7/0025
320/126
(Continued)

FOREIGN PATENT DOCUMENTS

CA 3107893 A1 2/2020
CN 105006854 A 10/2015
(Continued)

OTHER PUBLICATIONS

International Search Report Corresponding with Application No. PCT/CN2020/080570 Dec. 21, 2020 (2 pages).
(Continued)

*Primary Examiner* — John T Trischler
(74) *Attorney, Agent, or Firm* — Dority & Manning, P.A.

(57) ABSTRACT

A method includes determining a first voltage level of a first battery and a second voltage level of a second battery. Based on a difference between the first voltage level and the second voltage level satisfying a first threshold and a magnitude of a current failing to satisfy a second threshold, one of the first battery or the second battery is disconnected from the one or more components, and the one or more components of the portable device are powered using the other of the first battery or the second battery. Based on one or more of the difference between the first voltage level and the second voltage level failing to satisfy the first threshold or the magnitude of the current failing to satisfy the second threshold, the one or more components of the portable device are powered using the first battery and the second battery.

20 Claims, 16 Drawing Sheets

(51) Int. Cl.

| | |
|---|---|
| *H02J 7/00* | (2006.01) |
| *H02J 7/82* | (2026.01) |
| *H02J 7/94* | (2026.01) |
| *H02J 7/96* | (2026.01) |
| G01R 31/3835 | (2019.01) |
| H02J 1/10 | (2006.01) |
| H02J 7/34 | (2006.01) |
| H02J 7/50 | (2026.01) |
| H02J 7/63 | (2026.01) |
| H02J 7/80 | (2026.01) |
| H02J 105/42 | (2026.01) |
| H02J 105/44 | (2026.01) |

(52) U.S. Cl.
CPC ................. *H02J 7/94* (2026.01); *H02J 7/96*
(2026.01); *G01R 31/3835* (2019.01); *H02J*
*1/10* (2013.01); *H02J 1/106* (2020.01); *H02J*
*7/34* (2013.01); *H02J 7/575* (2026.01); *H02J*
*7/63* (2026.01); *H02J 7/80* (2026.01); *H02J*
*2105/42* (2026.01); *H02J 2105/44* (2026.01);
*Y02B 70/30* (2013.01); *Y02B 70/3225*
(2013.01); *Y04S 20/222* (2013.01); *Y04S*
*20/242* (2013.01)

(58) Field of Classification Search
USPC ........................................................ 320/126
See application file for complete search history.

(56) References Cited

U.S. PATENT DOCUMENTS

| 7,598,706 | B2 * | 10/2009 | Koski | H02J 7/0016 |
|---|---|---|---|---|
| | | | | 320/128 |
| 7,830,126 | B2 * | 11/2010 | Kawahara | H02J 7/0031 |
| | | | | 320/160 |
| 8,441,228 | B2 * | 5/2013 | Brabec | H02J 7/342 |
| | | | | 180/65.21 |
| 8,541,905 | B2 * | 9/2013 | Brabec | B60L 53/00 |
| | | | | 320/116 |
| 8,648,568 | B2 * | 2/2014 | McCollum | G06F 1/30 |
| | | | | 307/49 |
| 8,704,405 | B2 * | 4/2014 | Deng | H02J 7/0014 |
| | | | | 307/71 |
| 9,102,241 | B2 * | 8/2015 | Brabec | B60L 58/22 |
| 9,136,714 | B2 * | 9/2015 | Tsai | H02J 7/0014 |
| 9,142,979 | B2 * | 9/2015 | Tsai | H02J 7/0014 |
| 9,148,029 | B2 * | 9/2015 | Tsai | H02J 7/0014 |
| 9,172,255 | B2 * | 10/2015 | Tsai | H02J 7/0014 |
| 9,172,256 | B2 * | 10/2015 | Tsai | H02J 7/0014 |
| 9,199,543 | B2 * | 12/2015 | Brabec | H02J 7/342 |
| 9,219,366 | B2 * | 12/2015 | Kim | H02J 7/00 |
| 9,524,018 | B2 * | 12/2016 | Sultenfuss | G06F 1/28 |
| 9,531,037 | B2 * | 12/2016 | Ogg | G01R 31/396 |
| 9,570,923 | B2 * | 2/2017 | Nomura | H02J 7/0016 |
| 9,694,697 | B2 * | 7/2017 | Brabec | H02M 3/1582 |
| 9,780,577 | B2 * | 10/2017 | Suzuki | B60L 58/12 |
| 9,849,850 | B2 * | 12/2017 | Iwai | B60R 25/30 |
| 10,050,437 | B2 * | 8/2018 | Nomoto | H01M 10/441 |
| 10,326,287 | B2 * | 6/2019 | Hoyt | H02J 7/0024 |
| 10,693,198 | B2 * | 6/2020 | Ito | H02J 7/0032 |
| 10,700,535 | B2 * | 6/2020 | Minakuchi | H02J 7/0048 |
| 10,829,066 | B2 * | 11/2020 | Boecker | B60L 3/0046 |
| 10,855,100 | B2 * | 12/2020 | Takita | H02J 7/0029 |
| 11,038,213 | B2 * | 6/2021 | Mori | H02J 7/34 |
| 11,128,158 | B2 * | 9/2021 | Mulawski | H02J 7/0047 |
| 11,146,094 | B2 * | 10/2021 | Ohashi | H02J 7/0068 |
| 11,205,905 | B2 * | 12/2021 | Park | H01M 10/4207 |
| 11,230,205 | B2 * | 1/2022 | Ohmori | B60L 58/22 |
| 11,283,270 | B2 * | 3/2022 | Kim | H05K 5/10 |
| 11,336,105 | B2 * | 5/2022 | Xiao | H02J 7/0068 |
| 11,362,524 | B2 * | 6/2022 | Mituta | B60L 53/62 |
| 11,381,094 | B2 * | 7/2022 | Park | H02J 7/0048 |
| 11,398,743 | B2 * | 7/2022 | Kim | H02J 7/0013 |
| 11,465,764 | B2 * | 10/2022 | Melack | B64D 27/357 |
| 11,476,677 | B2 * | 10/2022 | Liu | H01M 10/4257 |
| 11,695,165 | B2 * | 7/2023 | Kim | H01M 10/425 |
| | | | | 320/136 |
| 11,745,883 | B2 * | 9/2023 | Melack | B64D 27/34 |
| | | | | 307/9.1 |
| 11,813,946 | B2 * | 11/2023 | Boecker | B60L 58/21 |
| 11,942,807 | B2 * | 3/2024 | Wang | H02J 7/00304 |
| 11,945,594 | B2 * | 4/2024 | Melack | B64C 29/0033 |
| 11,979,042 | B2 * | 5/2024 | Kawamoto | H02J 7/0068 |
| 12,040,460 | B2 * | 7/2024 | Books | B60L 53/62 |
| 12,162,614 | B2 * | 12/2024 | Melack | B64D 27/31 |
| 12,208,668 | B2 * | 1/2025 | Lu | B60L 53/16 |
| 12,257,924 | B2 * | 3/2025 | Ueno | B60L 3/0092 |
| 12,266,955 | B2 * | 4/2025 | Ruan | H02J 7/00032 |
| 12,296,694 | B2 * | 5/2025 | Feldkamp | B60L 1/00 |
| 2007/0247106 | A1 * | 10/2007 | Kawahara | B60L 58/22 |
| | | | | 320/104 |
| 2008/0174274 | A1 * | 7/2008 | Kosaka | H02J 7/0016 |
| | | | | 320/117 |
| 2008/0180061 | A1 * | 7/2008 | Koski | H01M 10/441 |
| | | | | 320/136 |
| 2010/0295513 | A1 * | 11/2010 | McCollum | G06F 1/26 |
| | | | | 320/136 |
| 2011/0025124 | A1 * | 2/2011 | Brabec | H02J 7/342 |
| | | | | 307/9.1 |
| 2011/0025125 | A1 * | 2/2011 | Brabec | H02J 7/0071 |
| | | | | 307/9.1 |
| 2011/0025126 | A1 * | 2/2011 | Brabec | H02M 3/1584 |
| | | | | 307/9.1 |
| 2011/0234006 | A1 * | 9/2011 | Deng | H01M 10/482 |
| | | | | 307/71 |
| 2013/0221897 | A1 * | 8/2013 | Brabec | H02J 7/342 |
| | | | | 320/104 |
| 2013/0334878 | A1 * | 12/2013 | Brabec | B60L 53/00 |
| | | | | 307/9.1 |
| 2014/0002003 | A1 * | 1/2014 | Kim | H02J 7/0019 |
| | | | | 429/61 |
| 2014/0015472 | A1 * | 1/2014 | Tsai | H02J 7/0014 |
| | | | | 320/103 |
| 2014/0015473 | A1 * | 1/2014 | Tsai | H02J 7/0014 |
| | | | | 320/103 |
| 2014/0015474 | A1 * | 1/2014 | Tsai | H02J 7/0014 |
| | | | | 320/103 |
| 2014/0015477 | A1 * | 1/2014 | Tsai | H02J 7/0014 |
| | | | | 320/126 |
| 2014/0015490 | A1 * | 1/2014 | Tsai | H02J 7/0014 |
| | | | | 320/134 |
| 2014/0019111 | A1 * | 1/2014 | Tsai | H02J 7/0014 |
| | | | | 703/18 |
| 2014/0152262 | A1 * | 6/2014 | Nomoto | H01M 10/482 |
| | | | | 320/126 |
| 2014/0225443 | A1 * | 8/2014 | Nomoto | H02J 7/00712 |
| | | | | 307/77 |
| 2015/0035492 | A1 * | 2/2015 | Nomura | H02J 7/0016 |
| | | | | 320/126 |
| 2015/0067362 | A1 * | 3/2015 | Sultenfuss | G06F 1/30 |
| | | | | 713/320 |
| 2015/0194707 | A1 * | 7/2015 | Park | H01M 10/425 |
| | | | | 429/61 |
| 2015/0207346 | A1 * | 7/2015 | Toivola | H02J 7/342 |
| | | | | 320/134 |
| 2015/0298630 | A1 * | 10/2015 | Iwai | B60R 16/033 |
| | | | | 324/426 |
| 2015/0340884 | A1 * | 11/2015 | Suzuki | B60L 7/12 |
| | | | | 320/137 |
| 2016/0020022 | A1 | 1/2016 | Bao et al. | |
| 2016/0049812 | A1 * | 2/2016 | Li | H02J 7/0019 |
| | | | | 320/107 |
| 2016/0190834 | A1 * | 6/2016 | Minakuchi | H02J 7/0024 |
| | | | | 320/117 |
| 2017/0117591 | A1 * | 4/2017 | Ogg | G01R 31/3835 |
| 2017/0117718 | A1 * | 4/2017 | Yeh | H02J 7/0031 |
| 2017/0126043 | A1 * | 5/2017 | Yoshida | H02J 7/0014 |
| 2017/0264123 | A1 * | 9/2017 | Mulawski | H02J 7/0014 |
| 2017/0294691 | A1 * | 10/2017 | Yamamoto | H02J 7/007182 |
| 2018/0278065 | A1 | 9/2018 | Hoyt | |

(56)  References Cited

U.S. PATENT DOCUMENTS

| | | | | |
|---|---|---|---|---|
| 2018/0309172 A1* | 10/2018 | Ito | ......................... | H02J 7/0063 |
| 2018/0375177 A1* | 12/2018 | Mori | ......................... | H02J 1/10 |
| 2019/0092257 A1* | 3/2019 | Boecker | ................. | H02J 9/061 |
| 2019/0252908 A1* | 8/2019 | Takita | ...................... | H02H 7/00 |
| 2019/0356157 A1* | 11/2019 | Ohashi | ............... | H02J 7/00304 |
| 2020/0036198 A1* | 1/2020 | Kim | ...................... | H05K 5/0086 |
| 2020/0127471 A1* | 4/2020 | Minakuchi | ........... | H02J 7/0024 |
| 2020/0227925 A1* | 7/2020 | Park | ................. | H01M 10/4207 |
| 2020/0244075 A1* | 7/2020 | Park | ................. | H01M 10/425 |
| 2020/0280206 A1* | 9/2020 | Kim | ...................... | H02J 7/0071 |
| 2020/0361337 A1* | 11/2020 | Ohmori | ..................... | H02J 7/02 |
| 2021/0114536 A1* | 4/2021 | Boecker | ................. | B60R 16/04 |
| 2021/0119277 A1* | 4/2021 | Kim | .................. | H02J 7/007182 |
| 2021/0143650 A1* | 5/2021 | Wang | ................. | H02J 7/00304 |
| 2021/0175731 A1* | 6/2021 | Xiao | ..................... | H02J 7/0047 |
| 2021/0226267 A1* | 7/2021 | Books | ....................... | H02J 7/14 |
| 2021/0257843 A1* | 8/2021 | Mituta | .................... | B60L 53/62 |
| 2021/0305832 A1* | 9/2021 | Kawamoto | ....... | H02J 7/007182 |
| 2022/0177145 A1* | 6/2022 | Melack | .................. | B64D 27/31 |
| 2022/0203816 A1* | 6/2022 | Lu | ..................... | H01M 10/425 |
| 2022/0224129 A1* | 7/2022 | Liu | ..................... | H01M 10/425 |
| 2022/0289045 A1* | 9/2022 | Feldkamp | ............ | A01D 34/006 |
| 2023/0027457 A1* | 1/2023 | Wu | ......................... | B60L 53/62 |
| 2023/0083686 A1* | 3/2023 | Ruan | ..................... | H02J 7/0063 320/117 |
| 2023/0166854 A1* | 6/2023 | Melack | .................. | B64D 27/31 307/9.1 |
| 2023/0170722 A1* | 6/2023 | Lee | .................. | H02J 7/007182 320/126 |
| 2023/0238817 A1* | 7/2023 | Wang | .................... | H02J 7/0063 320/118 |
| 2023/0264597 A1* | 8/2023 | Ueno | ......................... | B60L 3/04 701/22 |
| 2023/0275518 A1* | 8/2023 | Kawakami | ........ | H02M 3/33584 320/117 |
| 2023/0344246 A1* | 10/2023 | Ye | ......................... | H02J 7/0047 |
| 2023/0382543 A1* | 11/2023 | Melack | .................. | B64D 27/24 |
| 2024/0055879 A1* | 2/2024 | Wang | .................... | H02J 7/0047 |
| 2024/0128616 A1* | 4/2024 | Zhang | ................. | H01M 10/425 |
| 2024/0136828 A1* | 4/2024 | Ye | ......................... | H02J 7/0019 |
| 2024/0162721 A1* | 5/2024 | Griffith | ............... | H02J 7/0047 |
| 2024/0186602 A1* | 6/2024 | Nguyen | ............ | H01M 50/107 |
| 2024/0246686 A1* | 7/2024 | Melack | .................. | B64D 27/34 |
| 2024/0258802 A1* | 8/2024 | Wang | .................... | A01D 69/02 |
| 2025/0062629 A1* | 2/2025 | Kwon | .................. | H02J 7/0019 |
| 2025/0083539 A1* | 3/2025 | Feldkamp | ............... | B60L 50/64 |
| 2025/0105652 A1* | 3/2025 | Bijlenga | ............. | H02J 7/00714 |
| 2025/0121670 A1* | 4/2025 | Lu | ....................... | H01M 10/425 |
| 2025/0187738 A1* | 6/2025 | Melack | ............... | B64D 27/357 |

FOREIGN PATENT DOCUMENTS

| | | |
|---|---|---|
| CN | 108899952 A | 11/2018 |
| CN | 108988470 A | 12/2018 |
| CN | 110383616 A | 10/2019 |
| CN | 110690752 A | 1/2020 |
| KR | 101567423 B1 | 11/2015 |
| KR | 101572612 B1 | 12/2015 |
| TW | 201944684 A | 11/2019 |

OTHER PUBLICATIONS

Chinese Office Action Corresponding to Application No. 202080097276 on Oct. 24, 2024.

Taiwanese Office Action Corresponding to Application No. 110110180 on Nov. 13, 2024.

European Search Report Corresponding with Application No. EP20927728 on Nov. 10, 2023 (1 page).

* cited by examiner

100

Multi-Battery
Management
Device
110

100

110 Multi-Battery Management Device

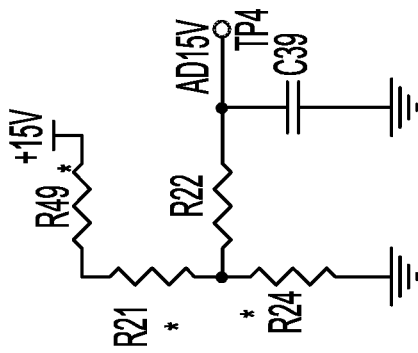
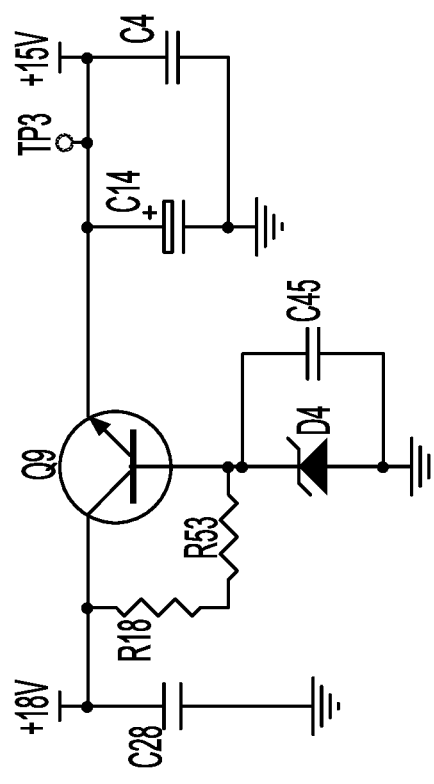
FIG. 6E

MULTI-BATTERY MANAGEMENT FOR A PORTABLE DEVICE

This application claims the benefit of priority to International Patent Application No. PCT/CN2020/080570, filed on Mar. 23, 2020, the disclosure of which is incorporated by reference herein in its entirety.

TECHNICAL FIELD

The present invention relates generally to batteries and, more particularly, to battery management for portable devices.

BACKGROUND OF THE INVENTION

The use of various forms of batteries has become nearly ubiquitous in today's world. As more and more portable or cordless devices, such as power tools (e.g., drills, saws, grass trimmers, blowers, sanders, etc.), small appliances (e.g., mixers, blenders, coffee grinders, etc.), communications devices (e.g., smartphones, personal digital assistants, etc.), and office equipment (e.g., computers, tablets, printers, etc.), are in widespread use, the use of battery technologies of varying chemistry and configuration is commonplace.

A cordless device may power components using a single battery or multiple batteries. For some applications, use of multiple batteries can provide better performance as compared to use of a single battery, such as by enabling a greater range of current that can be supplied to components of a portable device. Further, use of multiple batteries can increase reliability of a portable device.

In some circumstances, implementation of multiple batteries in a portable device is expensive. For example, a "matching" process may be performed during device fabrication or assembly to ensure that the batteries have similar characteristics, such as charge capacity, charge rate, discharge rate, impedance, or other characteristics. In some cases, one or more batteries may be unused, replaced, and/or discarded due to being "mismatched" to other batteries. As a result, product yield can be reduced, increasing cost associated with a portable device. Further, if one or more characteristics of batteries of a portable device are mismatched, performance may be degraded.

BRIEF SUMMARY OF THE INVENTION

In accordance with an aspect of the disclosure, a portable device includes a multi-battery management device configured to perform battery management operations, such as a battery "balancing" process. The multi-battery management device may selectively connect or disconnect batteries of the portable device from one or more components of the portable device, such as an electric motor of the portable device. The multi-battery management device may be configured to perform the connection or disconnection based on a difference between voltage levels of the batteries, based on a magnitude of a current supplied to the one or more components, or a combination thereof.

To illustrate, in one example, the multi-battery management device may compare the difference between the voltage levels of the batteries to a first threshold. In response to the difference satisfying (e.g., being greater than, or being greater than or equal to) the first threshold, the multi-battery management device may disconnect one of the batteries from the one or more components. The multi-battery management device may be configured to select the battery with the lower voltage level for disconnection (e.g., to avoid charging of the battery by another battery) and may provide power to the one or more components using the battery with the greater voltage level. Alternatively, if the difference between the voltage levels of the batteries fails to satisfy the first threshold, then both the batteries may be connected to the one or more components.

In an illustrative example, the multi-battery management device is configured to determine a magnitude of a current provided to the one or more components. In response to the magnitude of the current satisfying a second threshold, the multi-battery management device may couple each of the batteries to the one or more components (e.g., irrespective of the voltage levels of the batteries). As a result, power provided to the one or more components may be increased (e.g., during a high-power activity, such as where a motor produces a large amount of horsepower or torque).

Selectively connecting and disconnecting batteries using the multi-battery management device may improve performance, reliability, or lifespan of a portable device. For example, by selectively disconnecting a battery, repetitive charging and discharging of one battery by another battery may be reduced or avoided. As a result, battery lifespan may be extended for some battery technologies.

Further, in some cases, use of the multi-battery management device may enable a more "relaxed" matching process during device fabrication or assembly. For example, by compensating for differences between batteries (e.g., charge capacity, charge rate, discharge rate, or impedance) using selective connection and disconnection of batteries, a tolerance range for matching batteries may be relaxed, increasing product yield. Alternatively or in addition, one or more testing operations of the matching process may be omitted, such as by omitting testing of charge capacity, charge rate, discharge rate, impedance, one or more other characteristics, or a combination thereof.

In addition, use of switchable parallel-connected batteries in accordance with some aspects of the disclosure may avoid certain drawbacks associated with series-connected batteries. To illustrate, certain conventional portable devices avoid battery-to-battery charging by implementing a power source that includes multiple batteries connected in series. As a result, output power is increased (due to increased voltage of the power source), which may involve redesigning one or more device components to accommodate the increased voltage (e.g., by implementing a higher-power motor and control circuit that are compatible with the increased voltage). By using switchable parallel-connected batteries in accordance with some aspects of the disclosure, output power can be increased without a redesign to implement higher-power components (thus reducing device cost) and while reducing or avoiding battery-to-battery charging as in some conventional multi-battery designs.

Further, use of multiple switchable batteries in accordance with some aspects of the disclosure may increase an amount of power available to one or more device components (e.g., an electric motor) while also providing certain advantages associated with single-battery implementations. For example, in some portable devices, a battery having a low voltage state may cause a power-down or shut-off event of the portable device. In a portable device according to some aspects of the disclosure, a first battery having a low voltage can be disconnected from one or more components prior to the low voltage causing a power-off state of the portable device. The portable device may continue to operate using a second battery having a greater voltage than the first battery. In this state, the portable device may operate using a low-power or reduced-power mode, which may be preferable in some cases to entering a shut-off state as in certain conventional portable devices.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which:

FIGS. 6A, 6B, 6C, 6D, 6E, 6F, 6G, 6H, and 6I show additional examples of circuits that may be included in a portable device, such as the portable device of FIG. 1, in accordance with some aspects of the disclosure.

DETAILED DESCRIPTION OF THE INVENTION

Figure 1:
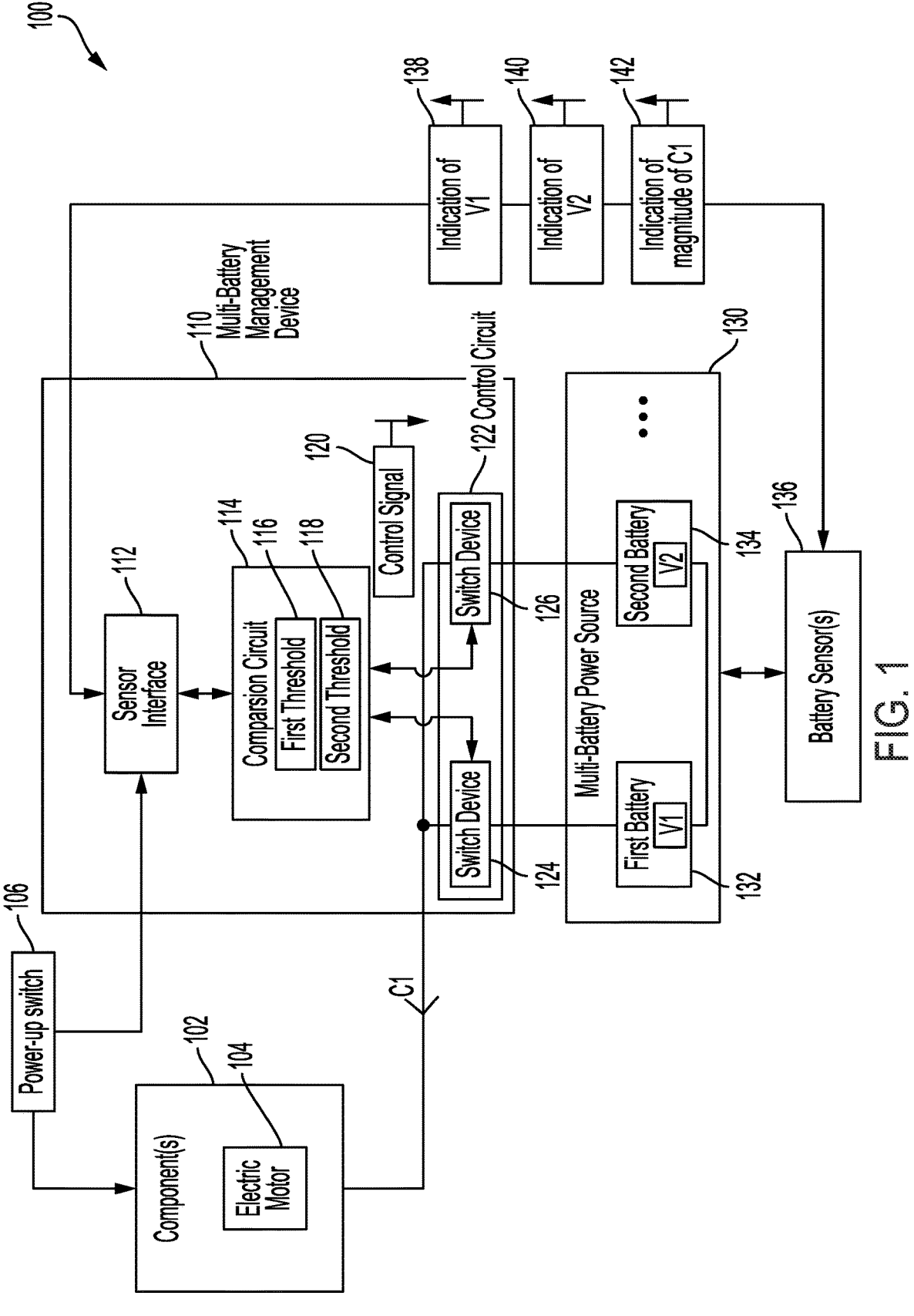
FIG. 1 shows an example of a portable device that includes a battery management device in accordance with some aspects of the disclosure.

Referring to FIG. 1, a particular illustrative example of a portable device is depicted and generally designated 100. The portable device 100 may correspond to a cordless power tool, such as an electric mower, an electric blower, or another power tool, as illustrative examples. In another example, the portable device 100 may correspond to another device, such as a cordless home appliance. In an additional example, the portable device 100 may correspond to a personal electronic device, such as a phone or a computer.

The portable device 100 includes one or more components 102 and a multi-battery power source 130. The one or more components 102 are configured to receive power from the multi-battery power source 130. In some examples, the one or more components 102 include an electric motor 104 of the portable device 100.

The multi-battery power source 130 includes a plurality of batteries. In the example of FIG. 1, the multi-battery power source 130 includes a first battery 132 and a second battery 134. In some examples, the second battery 134 is coupled in parallel to the first battery 132 or is configured to discharge in parallel with the first battery 132. Although two batteries 130, 132 are illustrated in the example of FIG. 1, in other examples, the multi-battery power source 130 may include a different number of batteries, such as three batteries, four batteries, or five batteries, etc. The multi-battery power source 130 is configured to provide a current C1 to the one or more components 102.

The current C1 is generated at least in part using the first battery 132 and the second battery 134. In one example, a first current provided by the first battery 132 is summed with a second current provided by the second battery 134 to generate the current C1.

In some examples, the multi-battery power source 130 includes one or more battery packs. A battery pack may include one or more batteries integrated within a battery enclosure, such as a protective battery casing. A battery enclosure may include a plastic material or a wrap material molded about the one or more batteries, as illustrative examples. To further illustrate, in one example, the first battery 132 includes a first battery pack, and the second battery 134 includes a second battery pack that is distinct from the first battery pack. In other examples, the first battery 132 and the second battery 134 are integrated within a common battery pack (or other device). In some examples, the first battery 132 and the second battery 134 include lithium-ion (Li-ion) batteries or one or more Li-ion battery packs. In other implementations, one or more other battery types may be used.

The portable device 100 further includes a multi-battery management device 110. The multi-battery management device 110 is coupled to the multi-battery power source 130. In the example of FIG. 1, the multi-battery management device 110 includes a sensor interface 112, a comparison circuit 114, and a control circuit 122.

The control circuit 122 may include a plurality of switch devices, such as a first switch device 124 and a second switch device 126. Each switch device 124, 126 may include one or more transistors. In one example, each switch device 124, 126 includes a plurality of field-effect transistors (FETs). The first switch device 124 is coupled to the first battery 132, and the second switch device 126 is coupled to the second battery 134. The first battery 132 is coupled to the one or more components 102 via the first switch device 124, and the second battery 134 is coupled to the one or more components 102 via the second switch device 126.

The portable device 100 may further include one or more battery sensors 136. The one or more battery sensors 136 may be coupled to the multi-battery power source 130 (e.g., to the first battery 132 and to the second battery 134). The one or more battery sensors 136 may be further coupled to the multi-battery management device 110 (e.g., to the sensor interface 112).

The portable device 100 may further include a power-up switch 106. The power-up switch 106 may be coupled to the one or more components 102 and to the multi-battery management device 110 (e.g., to the sensor interface 112).

During operation, the multi-battery power source 130 may supply power to the one or more components 102. To illustrate, in one example, the portable device corresponds to an electric mower, and the multi-battery power source 130 is configured to supply power to the electric motor 104 to operate a blade of the electric mower. In another example, the portable device corresponds to an electric blower, and the multi-battery power source 130 is configured to supply power to the electric motor 104 to operate a fan of the electric blower.

Batteries of the multi-battery power source 130 may be recharged using a power source. In some examples, the portable device 100 is configured to recharge batteries of the multi-battery power source 130 using a mains electricity supply. For example, the portable device 100 may include a power supply port that is configured to couple to a mains electricity outlet via a power supply device. Alternatively or in addition, batteries of the multi-battery power source 130 may be recharged using another energy recovery mechanism. To illustrate, batteries of the multi-battery power source 130 may be recharged using a regenerative energy recovery mechanism that slows a component (e.g., a rotor or other moving component) of the electric motor 104 by converting kinetic energy of the component to voltage that is supplied to the multi-battery power source 130 to recharge one or both of the first battery 132 and the second battery 134.

In some cases, batteries of the multi-battery power source 130 may discharge at different rates, may charge at different rates, or both. For example, trace differences in impedances associated with the first battery 132 and the second battery 134 (or other components connected to the first battery 132 and the second battery 134) may cause the first battery 132 and the second battery 134 to discharge unequally, to charge unequally, or both. As another example, a temperature difference between the first battery 132 and the second battery 134 (or other components) may cause the first battery 132 and the second battery 134 to discharge unequally, to charge unequally, or both. Further, in some cases, charge capacity or other characteristics of the first battery 132 may differ with respect to the second battery 134. As a result, a first voltage level V1 of the first battery 132 may differ from a second voltage level V2 of the second battery 134 in some cases.

In accordance with an aspect of the disclosure, the multi-battery management device 110 is configured designate, based on voltage levels of batteries of the multi-battery power source 130, at least one battery of the multi-battery power source 130 as a primary battery and to disconnect one or more other batteries of the multi-battery power source 130 from the one or more components 102. By disconnecting one or more batteries from the one or more components 102, the multi-battery management device 110 may reduce or avoid exchange of energy between batteries (e.g., where one battery provides energy to another battery instead of providing the energy to the one or more components 102). As a result, power supplied to the one or more components 102 may be increased as compared to systems in which at least some power is transferred from one battery to another battery during discharging (instead of to the one or more components 102), improving performance and user experience associated with the portable device 100.

To enable battery management operations, the multi-battery management device 110 is configured to receive one or more signals indicating operational characteristics of the first battery 132 and the second battery 134. To illustrate, the one or more signals may include a first indication 138 of the first voltage level V1 of the first battery 132, a second indication 140 of the second voltage level V2 of the second battery 134, and a third indication 142 of a magnitude of the current C1. In one example, the sensor interface 112 is configured to initiate a sensor operation performed by the one or more battery sensors 136 to generate the first indication 138 of the first voltage level V1 of the first battery 132, the second indication 140 of the second voltage level V2 of the second battery 134, and the third indication 142 of the magnitude of the current C1. The sensor interface 112 may be configured to receive the first indication 138 of the first voltage level V1, the second indication 140 of the second voltage level V2, and the third indication of the magnitude of the current C1 from the one or more battery sensors 136.

In some implementations, the sensor interface 112 is configured to perform one or more operations based on the first indication 138, the second indication 140, and the third indication 142. For example, depending on the particular implementation, the sensor interface 112 may be configured to perform a digital-to-analog (DAC) conversion operation or an analog-to-digital (ADC) conversion operation based on the first indication 138, the second indication 140, and the third indication 142. In another example, the sensor interface 112 may include one or more drivers configured to convert the first indication 138, the second indication 140, and the third indication 142 from a first supply voltage associated with a first voltage domain of the one or more battery sensors 136 to a second supply voltage associated with a second voltage domain of the multi-battery management device 110. Alternatively or in addition, the sensor interface 112 may be configured to perform impedance adjustment to match an input impedance of the multi-battery management device 110 to an output impedance of the one or more battery sensors 136.

The comparison circuit 114 is configured to receive, from the sensor interface 112, the first indication 138, the second indication 140, and the third indication 142 (or signals corresponding to the first indication 138, the second indication 140, and the third indication 142). The comparison circuit 114 is configured to determine a difference between the first voltage level V1 and the second voltage level V2. For example, the comparison circuit 114 may be configured to determine the difference by subtracting the first voltage level V1 from the second voltage level V2 (or vice versa).

The comparison circuit 114 is configured to compare the difference to a first threshold 116. The comparison circuit 114 may be configured to generate a first output indicating whether the difference satisfies (e.g., is greater than, or is greater than or equal to) the first threshold 116.

The control circuit 122 is configured to disconnect one of the first battery 132 or the second battery 134 from the one or more components 102 based at least in part on the difference between the first voltage level V1 and the second voltage level V2 satisfying the first threshold 116. For example, if the difference indicates that the first voltage level V1 is significantly larger than the second voltage level V2, then the second switch device 126 may be deactivated to decouple the second battery 134 from the one or more components 102 (and to reduce or avoid charging of the second battery 134 by the first battery 132). As another example, if the difference indicates that the second voltage level V2 is significantly larger than the first voltage level V1, then the first switch device 124 may be deactivated to decouple the first battery 132 from the one or more components 102 (and to reduce or avoid charging of the first battery 132 by the second battery 134).

In one example, the comparison circuit 114 is configured to provide one or more control signals to the control circuit 122 to selectively activate (or deactivate) the switch devices 124, 126. For example, the comparison circuit 114 may be configured to provide a control signal 120 (e.g., a multi-bit control signal) to the first switch device 124 or to the second switch device 126. In one example, the control signal 120 has a particular value that activates (or deactivates) the first switch device 124 or the second switch device 126. As an illustrative example, a first value (e.g., a logic zero value) of the control signal 120 may activate the first switch device 124 to couple the first battery 132 to the one or more components 102, and a second value (e.g., a logic one value) may deactivate the first switch device 124 to disconnect the first battery 132 from the one or more components 102. Further, similar control mechanisms may be provided for the second battery 134 (e.g., by providing a second control signal to the second switch device 126 similarly to the control signal 120 and the first switch device 124).

The multi-battery management device 110 is configured to select the first battery 132 for disconnection or the second battery 134 for disconnection based on a comparison of the voltage levels V1 and V2. For example, the multi-battery management device 110 may select the first battery 132 for disconnection based on the first voltage level V1 being less than the second voltage level V2. In another example, the multi-battery management device 110 may select the second battery 134 for disconnection based on the second voltage level V2 being less than the first voltage level V1.

In some implementations, a battery management operation is performed further based on the magnitude of the current C1. For example, if the magnitude of the current C1 is relatively large, then both batteries 132, 134 may be connected to the one or more components 102 (e.g., irrespectively of whether the difference between the first voltage level V1 and the second voltage level V2 satisfies the first threshold 116). In this case, both batteries 132, 134 may be used to enable a high-power mode of operation of the portable device 100. In another example, if the magnitude of the current C1 is relatively small, then one or both batteries 132, 134 may be selectively connected to the one or more components 102 (e.g., based on whether the difference between the first voltage level V1 and the second voltage level V2 satisfies the first threshold 116).

To further illustrate, the comparison circuit 114 may be configured to compare the magnitude of the current C1 to a second threshold 118. The comparison circuit 114 may be configured to generate a second output indicating whether the magnitude of the current C1 satisfies (e.g., is greater than, or is greater than or equal to) the second threshold 118. The comparison circuit 114 may be configured to set a value of the control signal 120 based on whether the difference between the first voltage level V1 and the second voltage level V2 satisfies the first threshold 116, based on whether the magnitude of the current C1 satisfies the second threshold 118, or both.

For example, the control signal 120 may have a first value (e.g., a logic zero value) if the difference between the first voltage level V1 and the second voltage level V2 fails to satisfy the first threshold 116, if the magnitude of the current C1 satisfies the second threshold 118, or both. In this example, both the batteries 132, 134 may supply power to the one or more components 102.

The control signal 120 may have a second value (e.g., a logic one value) if the difference between the first voltage level V1 and the second voltage level V2 satisfies the first threshold 116 and if the magnitude of the current C1 fails to satisfy the second threshold 118. In this case, a battery having a lower voltage level may be disconnected from the one or more components 102 via the control signal 120. For example, the second value of the control signal 120 may be provided to the first switch device 124 to disconnect the first battery 132 from the one or components 102 if the difference between the first voltage level V1 and the second voltage level V2 satisfies the first threshold 116, if the magnitude of the current C1 fails to satisfy the second threshold 118, and if the first voltage level V1 is less than the second voltage level V2. In another example, the second value of the control signal 120 may be provided to the second switch device 126 to disconnect the second battery 134 from the one or components 102 if the difference between the first voltage level V1 and the second voltage level V2 satisfies the first threshold 116, if the magnitude of the current C1 fails to satisfy the second threshold 118, and if the second voltage level V2 is less than the first voltage level V1.

After disconnecting one of the first battery 132 or the second battery 134 from the one or more components 102, power may be provided to the one or more components 102 from the other of the first battery 132 or the second battery 134. Alternatively, when both the first battery 132 and the second battery 134 are coupled to the one or more components 102, then power is provided to the one or more components 102 from both the first battery 132 and the second battery 134.

In some implementations, the multi-battery management device 110 is configured to detect a battery management trigger event and to initiate a battery management operation based on the battery management trigger event. In some examples, detecting the battery management trigger event includes detecting a power-up event at the portable device 100 (e.g., in response to user input received via the power-up switch 106), such as by detecting a power-up signal generated by the power-up switch 106 in response to user input received via the power-up switch 106. The power-up switch may be provided to the electric motor 104 to begin operation of the electric motor 104. For example, the multi-battery power source 130 may provide the current C1 to the one or more components 102 in response to the power-up event.

In response to detecting the battery management trigger event, the multi-battery management device 110 may determine the first voltage level V1 of the first battery 132 and the second voltage level V2 of the second battery 134. In one example, the sensor interface 112 is configured to initiate a sensor operation performed by the one or more battery sensors 136 in response to the battery management trigger event. For example, in response to receiving a power-up signal from the power-up switch 106, the sensor interface 112 may provide an enable signal to the one or more battery sensors 136 to initiate the sensor operation.

Alternatively or in addition, a battery management trigger event may include or correspond to one or more other events. For example, a battery management operation may be performed periodically or pseudo-periodically at the portable device 100. To illustrate, the portable device 100 may include a counter configured to store a value indicating an amount of time (e.g., a number of clock cycles) since a previous battery management operation. In response to detecting that the value satisfies a threshold, the multi-battery management device 110 may trigger a battery management operation (e.g., by triggering the one or more battery sensors 136 to measure or re-measure the first voltage level V1, the second voltage level V2, and the magnitude of the current C1) and may reset the value of the counter.

Alternatively or in addition, a battery management operation may be performed in response to detecting connection of the portable device 100 to a power source, in response to detecting disconnection of the portable device 100 from a power source, or both. To illustrate, a battery management operation may be performed in response to detecting that the portable device 100 is connected to a mains electricity outlet, in response to detecting that the portable device 100 is disconnected from a mains electricity outlet, or both.

In some examples, after changing operation to a single-battery mode of operation or a multi-battery mode of operation, the multi-battery management device 110 is configured to monitor indications of the voltage levels V1, V2 and the magnitude of the current C1 to determine whether to revert to the multi-battery mode or the single-battery mode. For example, the multi-battery management device 110 may be configured to revert from the single-battery mode to the multi-battery mode in response to detecting that the difference between the voltage levels V1, V2 no longer satisfies the first threshold 116 (or a third threshold) or that the magnitude of the current C1 satisfies the second threshold 118 (or a fourth threshold).

One or more aspects described with reference to FIG. 1 may improve performance of a portable device 100. For example, selectively connecting and disconnecting the batteries 132, 134 using the multi-battery management device 110 may improve performance, reliability, or lifespan of the multi-battery power source 130. As a particular example, by selectively disconnecting a battery of the multi-battery power source 130, repetitive charging and discharging of the battery by another battery of the multi-battery power source 130 may be reduced or avoided. As a result, battery lifespan may be extended for some battery technologies.

Further, in some cases, use of the multi-battery management device 110 may enable a more "relaxed" matching process during fabrication or assembly of the portable device 100. For example, by compensating for differences between the batteries 132, 134 (e.g., charge capacity, charge rate, discharge rate, or impedance) using selective connection and disconnection of the batteries 132, 134, a tolerance range for matching batteries may be relaxed. Alternatively or in addition, one or more testing operations of the matching process may be omitted, such as by omitting testing of the batteries 132, 134 for charge capacity, charge rate, discharge rate, impedance, one or more other characteristics, or a combination thereof.

Although certain examples are described with reference to connecting a single battery of the multi-battery power source 130 to the one or more components 102 and disconnecting a single battery of the multi-battery power source 130 from the one or more components 102, it is noted that other examples are also within the scope of the disclosure. For example, multiple batteries of the multi-battery power source 130 can be connected to the one or more components 102 while another battery of the multi-battery power source 130 is disconnected from the one or more components 102. Alternatively or in addition, one battery of the multi-battery power source 130 can be connected to the one or more components 102 while multiple other batteries of the multi-battery power source 130 are disconnected from the one or more components 102. Alternatively or in addition, multiple batteries of the multi-battery power source 130 can be connected to the one or more components 102 while multiple other batteries of the multi-battery power source 130 are disconnected from the one or more components 102.

It is noted that the features described with reference to the multi-battery management device 110 can be implemented using a variety of components or techniques, such as digital circuits, analog circuits, mixed-signal circuits, or a combination thereof. To illustrate, in some examples, the comparison circuit 114 includes analog hardware, such as one or more operational amplifiers (op amps) configured to perform comparisons of signals and to generate outputs indicating results of the comparisons. Alternatively or in addition, the multi-battery management device 110 may include a memory and a processor configured to retrieve instructions from the memory. The processor may execute the instructions to perform operations described herein. For example, the processor may execute a compare instruction to perform operations described with reference to the comparison circuit 114. Further, although two batteries 132, 134 are described for illustration, in other examples, one or more multi-battery management operations described herein can be applied to a different number of batteries, such as three or more batteries.

Figure 2:
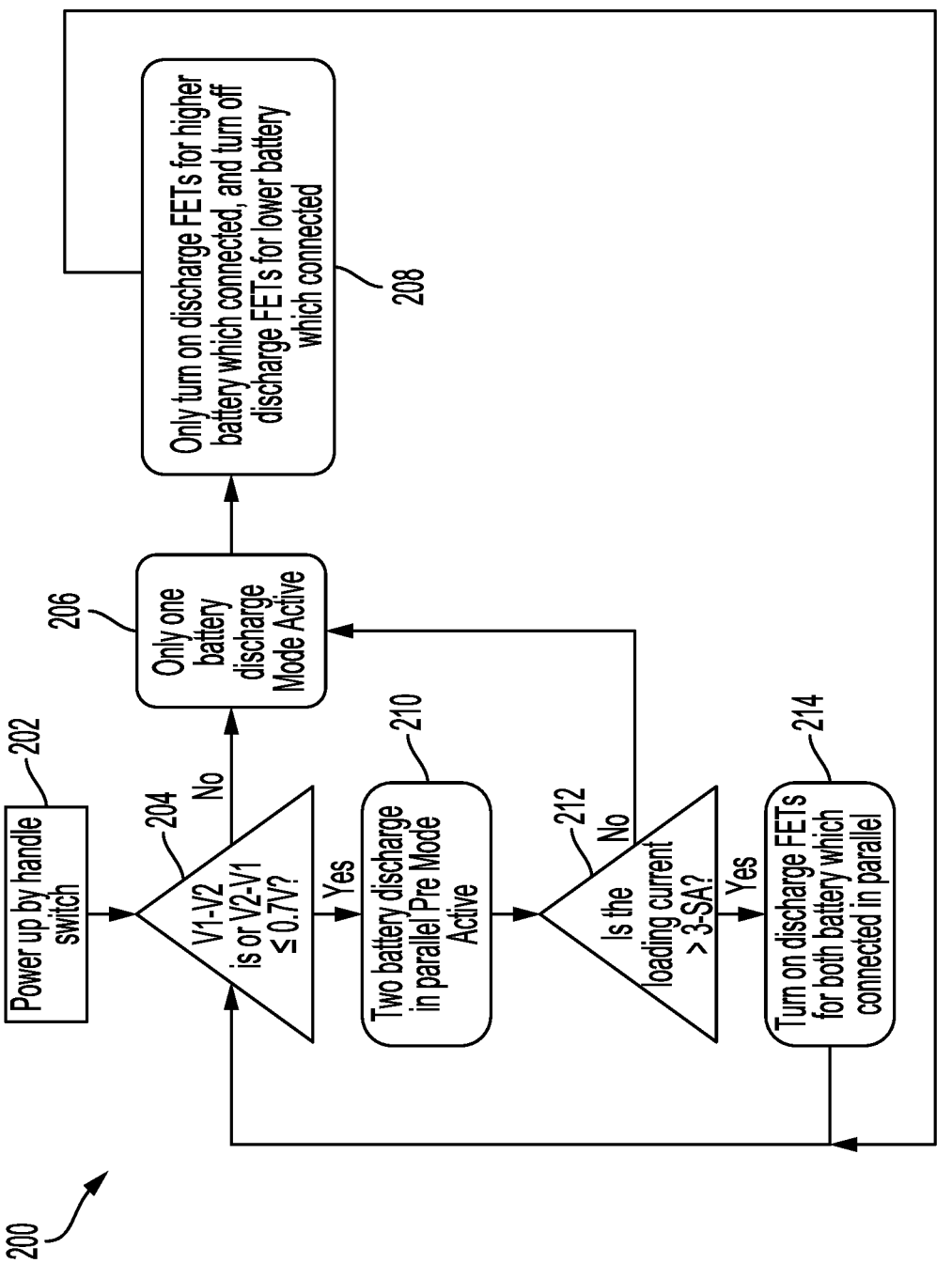
FIG. 2 shows a flow chart illustrating an example of a method of operation of a portable device, such as the portable device of FIG. 1, in accordance with some aspects of the disclosure.

Referring to FIG. 2, a particular illustrative example of a method is depicted and generally designated 200. In some examples, operations of the method 200 are performed by a portable device, such as the portable device 100 of FIG. 1.

The method 200 includes initiating a power-up operation by a handle switch, at 202. For example, the power-up switch 106 may correspond to a handle switch of the portable device 100. The power-up operation may be initiated in response to activation of the power-up switch 106.

The method 200 further includes determining whether a difference between voltage levels of batteries satisfies a threshold, at 204. For example, the multi-battery management device 110 may determine whether either the first voltage level V1 minus the second voltage level V2 or the second voltage level V2 minus the first voltage level V1 is less than or equal to the first threshold 116. In the non-limiting example of FIG. 2, the first threshold 116 may correspond to 0.7 volts (V). In other examples, the first threshold 116 may correspond to another value.

In response to determining that the difference satisfies the threshold (e.g., where the difference is greater than 0.7 V), the method 200 further includes operating according to a single-battery discharge mode, at 206. For example, the first battery 132 may be coupled to the one or more components 102 by activating the first switch device 124, and the second battery 134 may be decoupled from the one or more components 102 by deactivating the second switch device 126.

The method further includes selectively activating field-effect transistors (FETs) for a higher-voltage battery and deactivating FETs for a lower-voltage battery, at 208. For example, the first switch device 124 may be activated and the second switch device 126 may be deactivated in response to determining that the first voltage V1 is greater than the second voltage V2. In another example, the second switch device 126 may be deactivated and the first switch device 124 may be activated in response to determining that the second voltage V2 is greater than the first voltage V1.

Alternatively, in response to determining that the difference fails to satisfy the threshold (e.g., where the difference is less than or equal to 0.7 V), the method 200 includes operating according to a multi-battery discharge mode, at 210. For example, both the first battery 132 and the second battery 134 may be coupled to the one or more components 102 via the first switch device 124 and the second switch device 126, respectively.

The method 200 further includes determining whether a loading current exceeds a threshold, at 212. For example, the multi-battery management device 110 may determine whether the magnitude of the current C1 satisfies the second threshold 118. In the non-limiting example of FIG. 2, the second threshold 118 may correspond to three to five amps (A). In other examples, the second threshold 118 may correspond to another value.

In response to the loading current failing to exceed the threshold, the method 200 continues, at 206. Alternatively, in response to the loading current exceeding the threshold, the method 200 includes activating discharge FETs for both batteries, at 214. For example, both the first switch device 124 and the second switch device 126 may be activated to couple the first battery 132 and the second battery 134 to the one or more components 102.

One or more aspects described with reference to FIG. 2 may improve performance of a portable device. For example, selectively connecting and disconnecting batteries may improve performance, reliability, or lifespan of the batteries. As a particular example, by selectively disconnecting a battery, repetitive charging and discharging of the battery by another battery may be reduced or avoided. As a result, battery lifespan may be extended for some battery technologies.

Further, in some cases, selectively connecting and disconnecting batteries may enable a more "relaxed" matching process during fabrication or assembly of a portable device. For example, by compensating for differences between batteries (e.g., charge capacity, charge rate, discharge rate, or impedance) using selective connection and disconnection of the batteries, a tolerance range for matching batteries may be relaxed. Alternatively or in addition, one or more testing operations of the matching process may be omitted, such as by omitting testing of the batteries for charge capacity, charge rate, discharge rate, impedance, one or more other characteristics, or a combination thereof.

Figure 3:
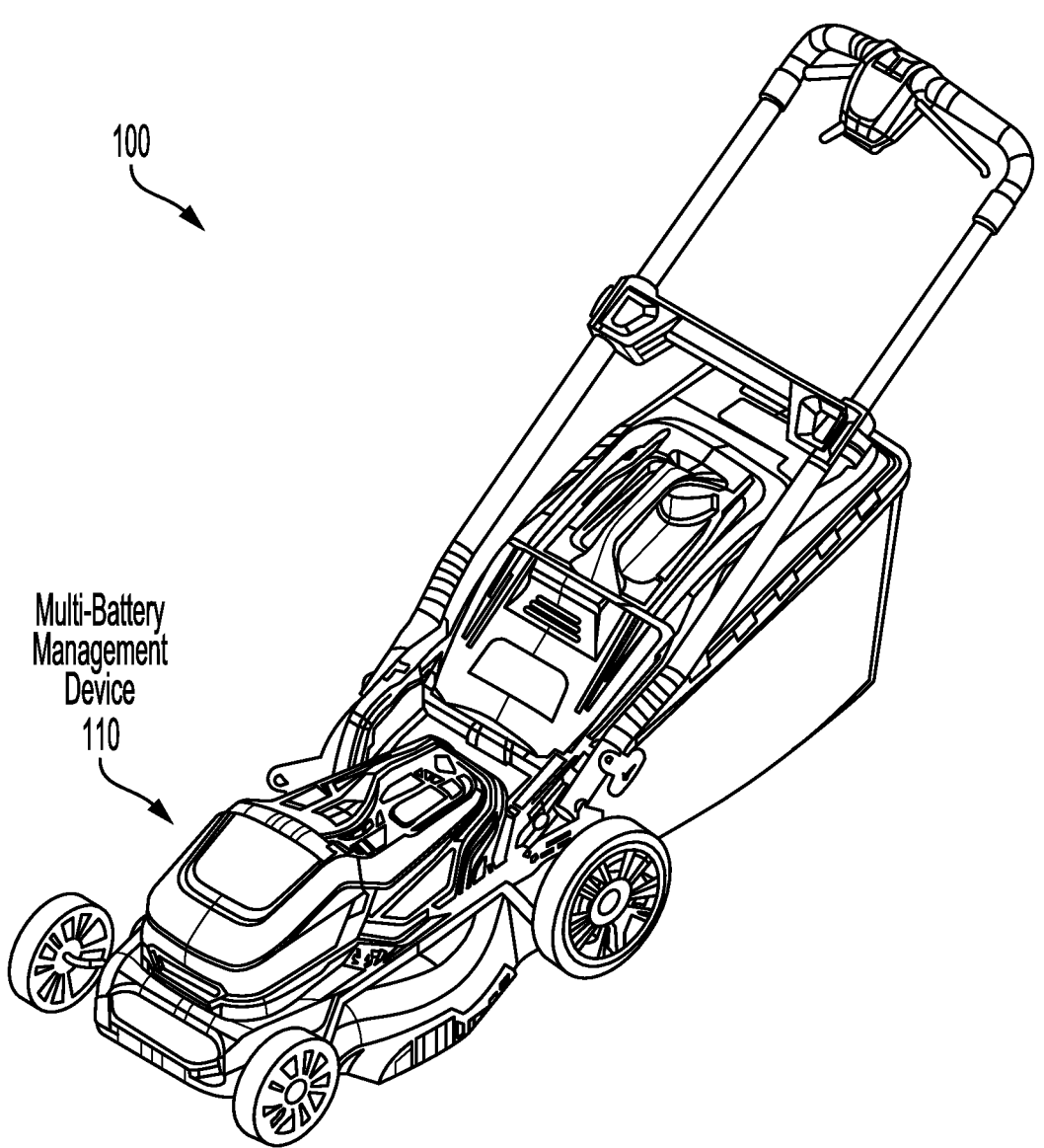
FIG. 3 shows an example of an electric mower configuration of the portable device of FIG. 1 in accordance with some aspects of the disclosure.

FIG. 3 depicts one illustrative configuration of the portable device 100. In the example of FIG. 3, the portable device 100 corresponds to an electric mower. In FIG. 3, the electric motor 104 may be configured to operate a blade of the portable device 100. For example, the electric motor 104 may include a stator configured to receive the current C1 and to generate an electromagnetic field based on the current C1. The electric motor 104 may further include a rotor configured to apply torque to a driveshaft in response to the electromagnetic field to turn the blade.

In some aspects of the disclosure, use of multiple switchable batteries in an electric mower reduces or avoids certain drawbacks associated with an electric mower that includes series-connected batteries. To illustrate, certain conventional electric mowers avoid battery-to-battery charging by implementing a power source that includes multiple batteries connected in series. As a result, output power is increased (due to increased voltage of the power source), which may involve redesign of one or more device components to accommodate the increased voltage (e.g., by implementing a higher-power motor and control circuit that are compatible with the increased voltage). By using switchable parallel-connected batteries in accordance with some aspects of the disclosure, output power of an electric mower can be increased without a redesign to implement higher-power components (thus reducing cost of the electric mower) while reducing or avoiding battery-to-battery charging as in some conventional multi-battery designs.

Figure 4:
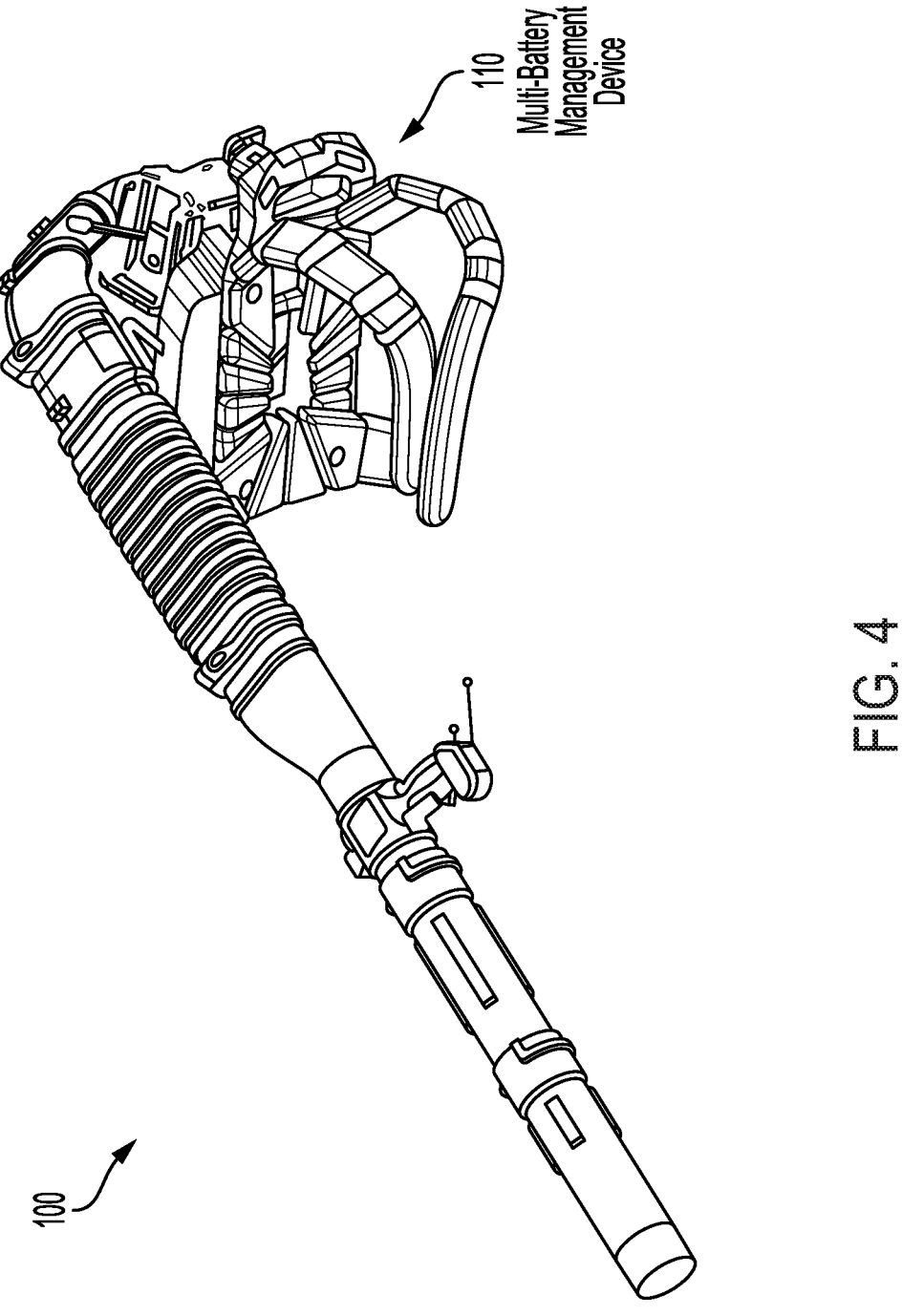
FIG. 4 shows an example of an electric blower configuration of the portable device of FIG. 1 in accordance with some aspects of the disclosure.

FIG. 4 depicts another illustrative configuration of the portable device 100. In the example of FIG. 4, the portable device 100 corresponds to an electric blower (e.g., a hand-held electric blower or a wearable electric blower, such as a backpack-mounted electric blower). In FIG. 4, the electric motor 104 may be configured to operate a fan of the portable device 100. For example, the electric motor 104 may be configured to rotate a fan in response to the current C1. Rotation of the fan may draw air into the electric blower (e.g., due to a centrifugal force created by rotation of the fan), and the air may be compressed and emitted from a tube of the electric blower.

It is noted that various values and parameters described herein can have a value selected based on the particular application. For example, in the electric mower implementation of FIG. 3, higher voltage batteries may be used as compared to the electric blower implementation of FIG. 4. As an illustrative example, battery voltages of 58 V may be used for an electric blower implementation, and battery voltages of 18 V may be used for an electric mower implementation. Further, values of the first threshold 116 and the second threshold 118 may be selected based on the particular implementation, such as based on the battery voltages. As an example, the illustrative thresholds described with reference to FIG. 2 may be compatible with some implementations but not other implementations.

In some aspects of the disclosure, use of multiple switchable batteries in an electric blower reduces or avoids certain drawbacks associated with an electric blower that includes series-connected batteries. To illustrate, certain conventional electric blowers avoid battery-to-battery charging by implementing a power source that includes multiple batteries connected in series. As a result, output power is increased (due to increased voltage of the power source), which may involve redesign of one or more device components to accommodate the increased voltage (e.g., by implementing a higher-power motor and control circuit that are compatible with the increased voltage). By using switchable parallel-connected batteries in accordance with some aspects of the disclosure, output power of an electric blower can be increased without a redesign to implement higher-power components (thus reducing cost of the electric blower) and while reducing or avoiding battery-to-battery charging as in some conventional multi-battery designs.

Figure 5:
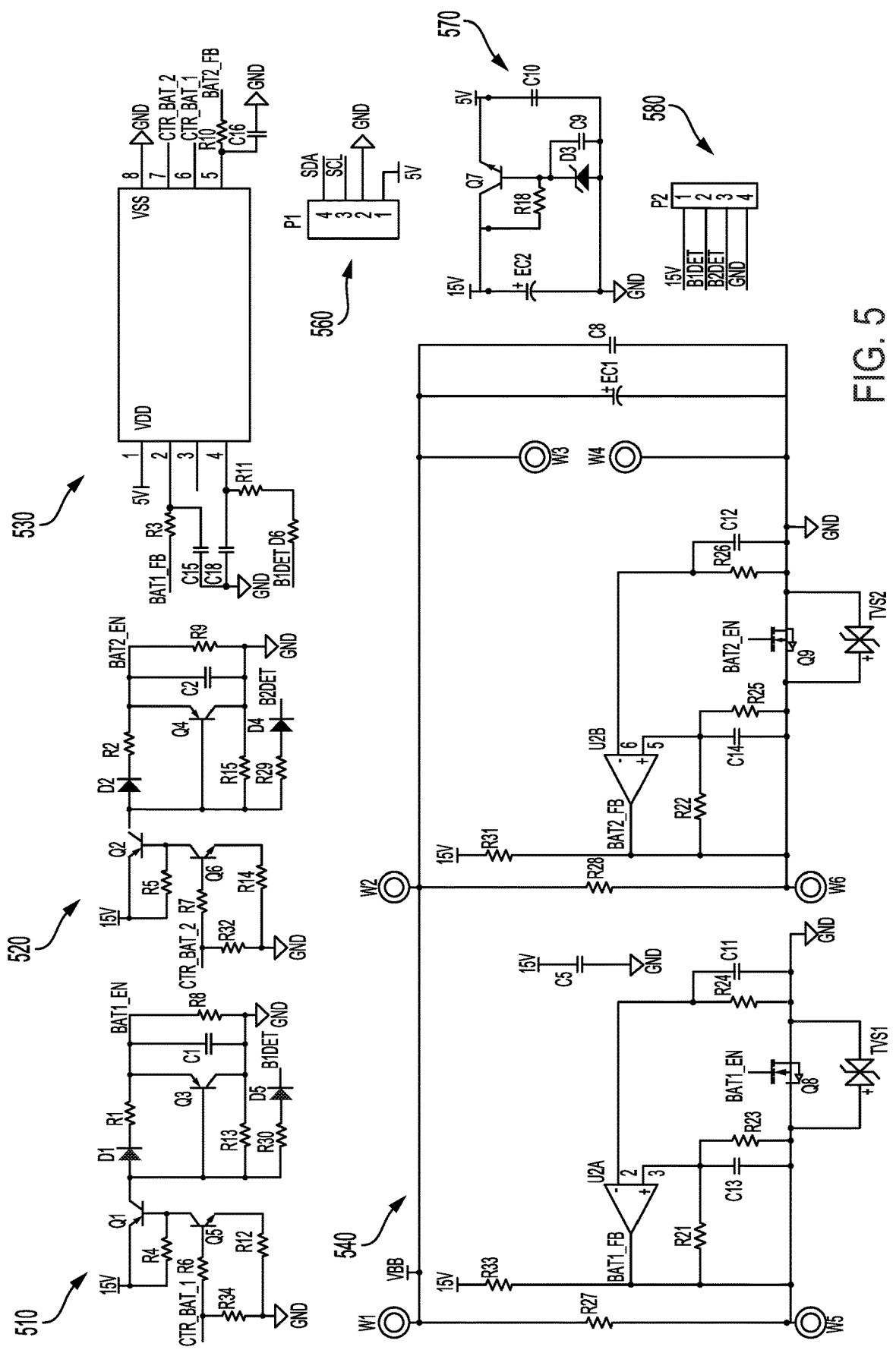
FIG. 5 shows examples of circuits that may be included in a portable device, such as the portable device of FIG. 1, in accordance with some aspects of the disclosure.
Figure 6A:
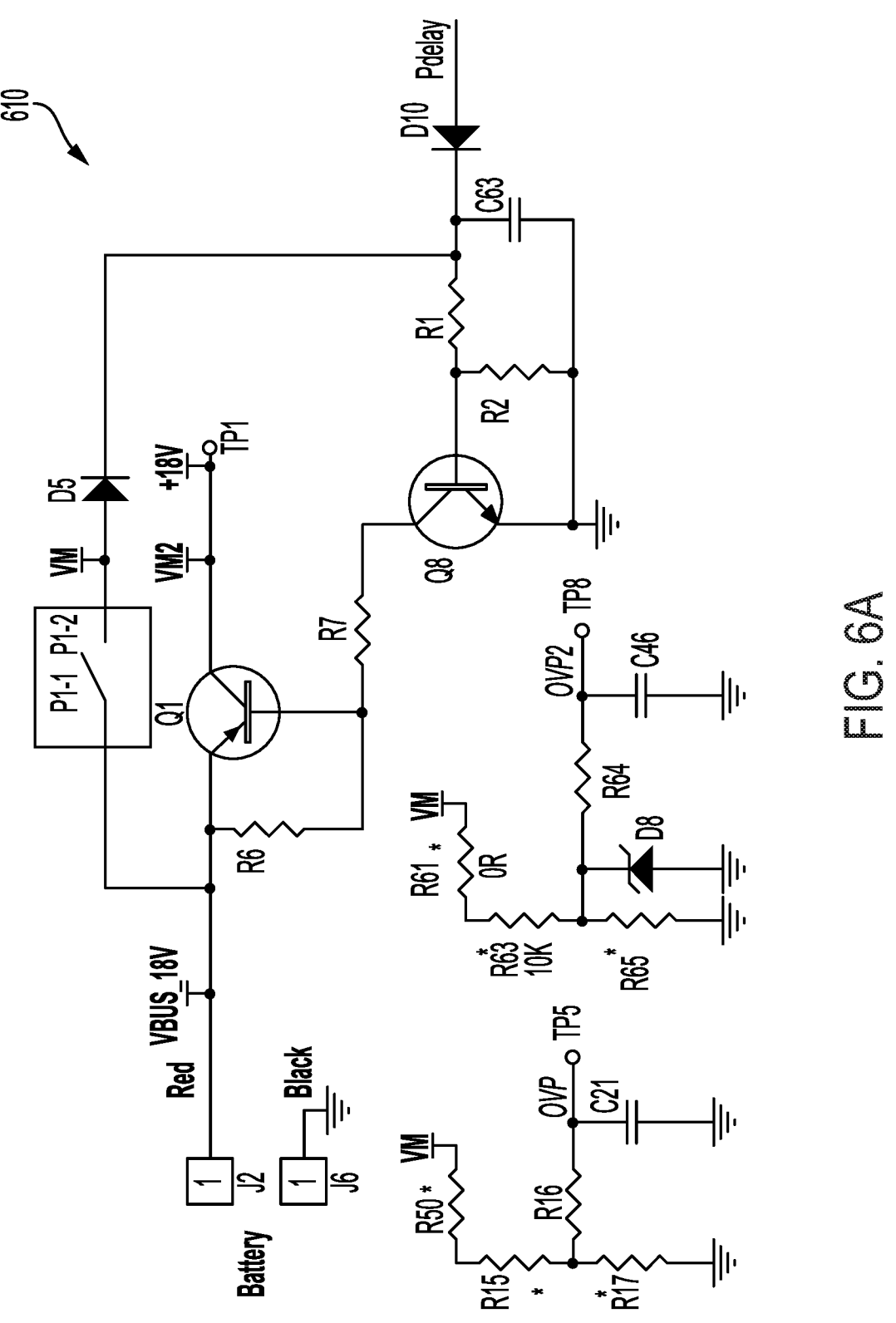
Figure 6B:
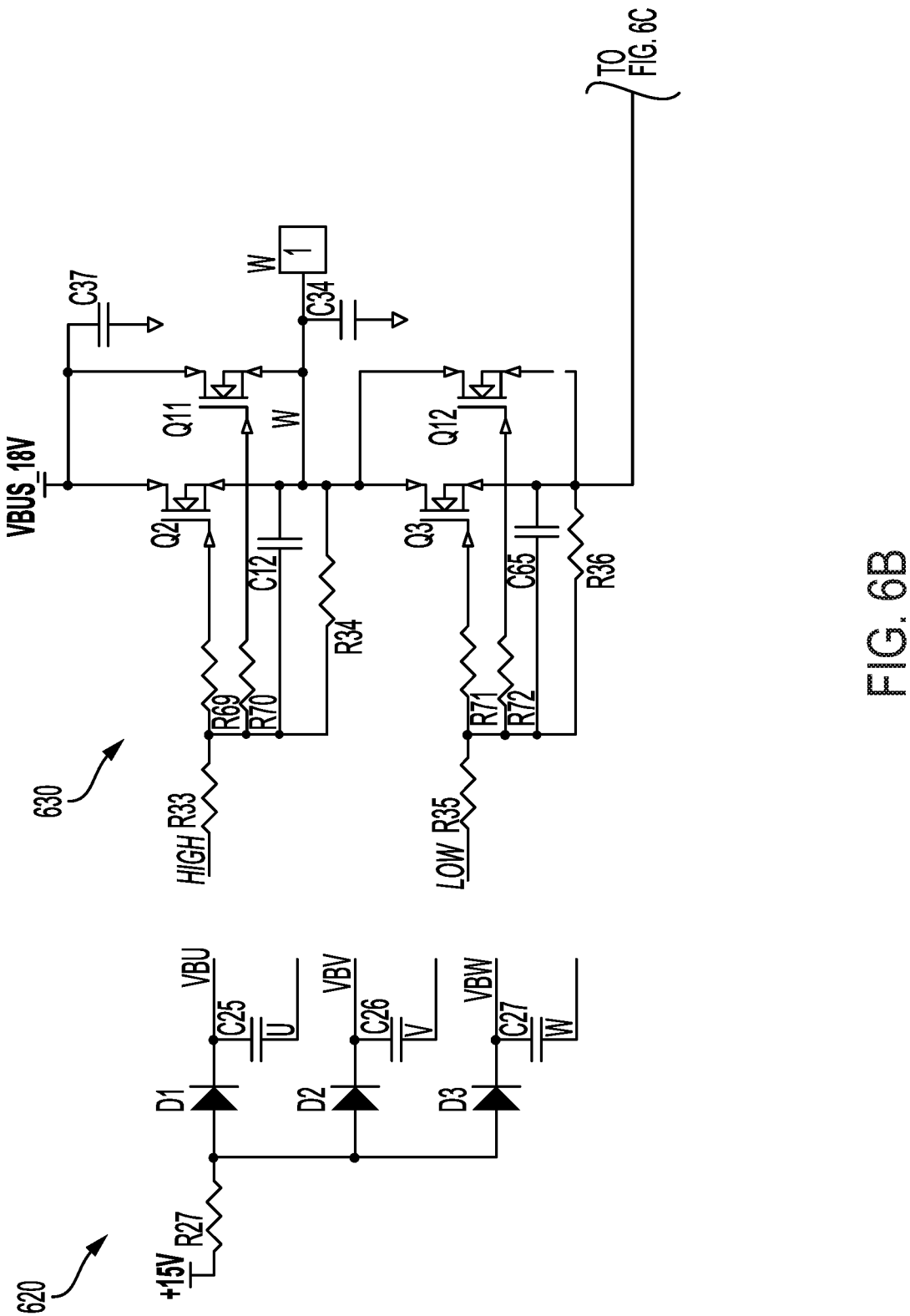
Figure 6C:
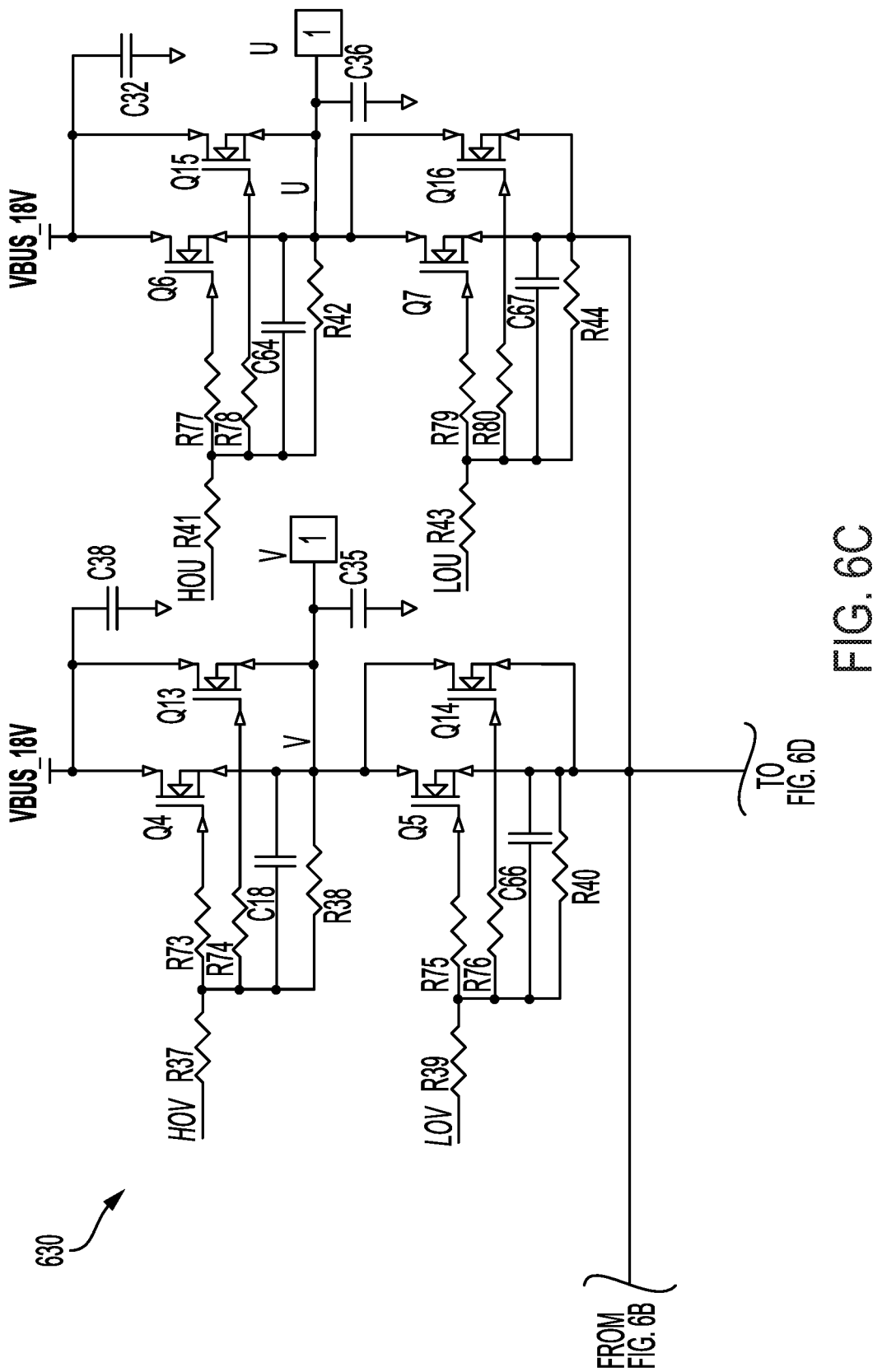
Figure 6D:
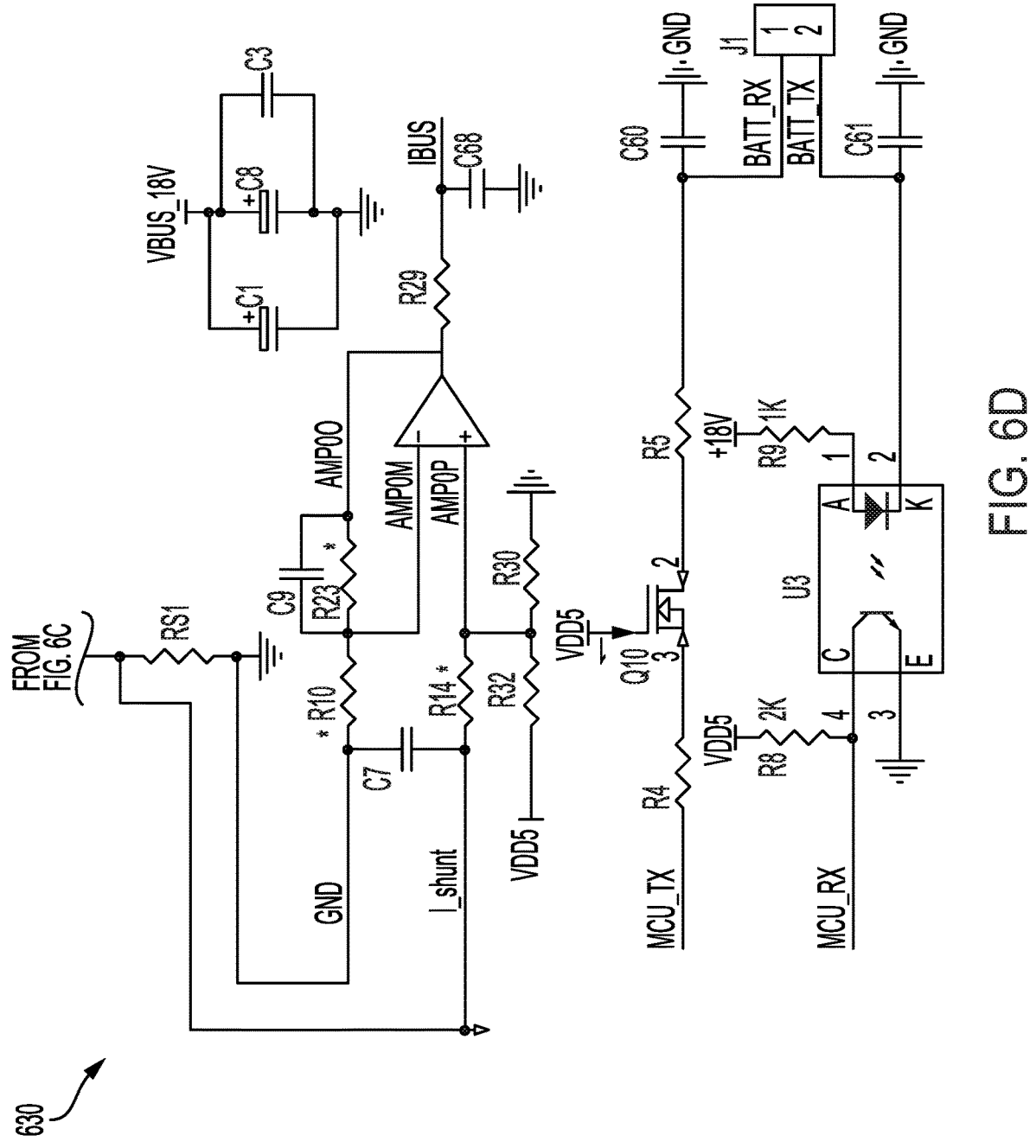
Figure 6F:
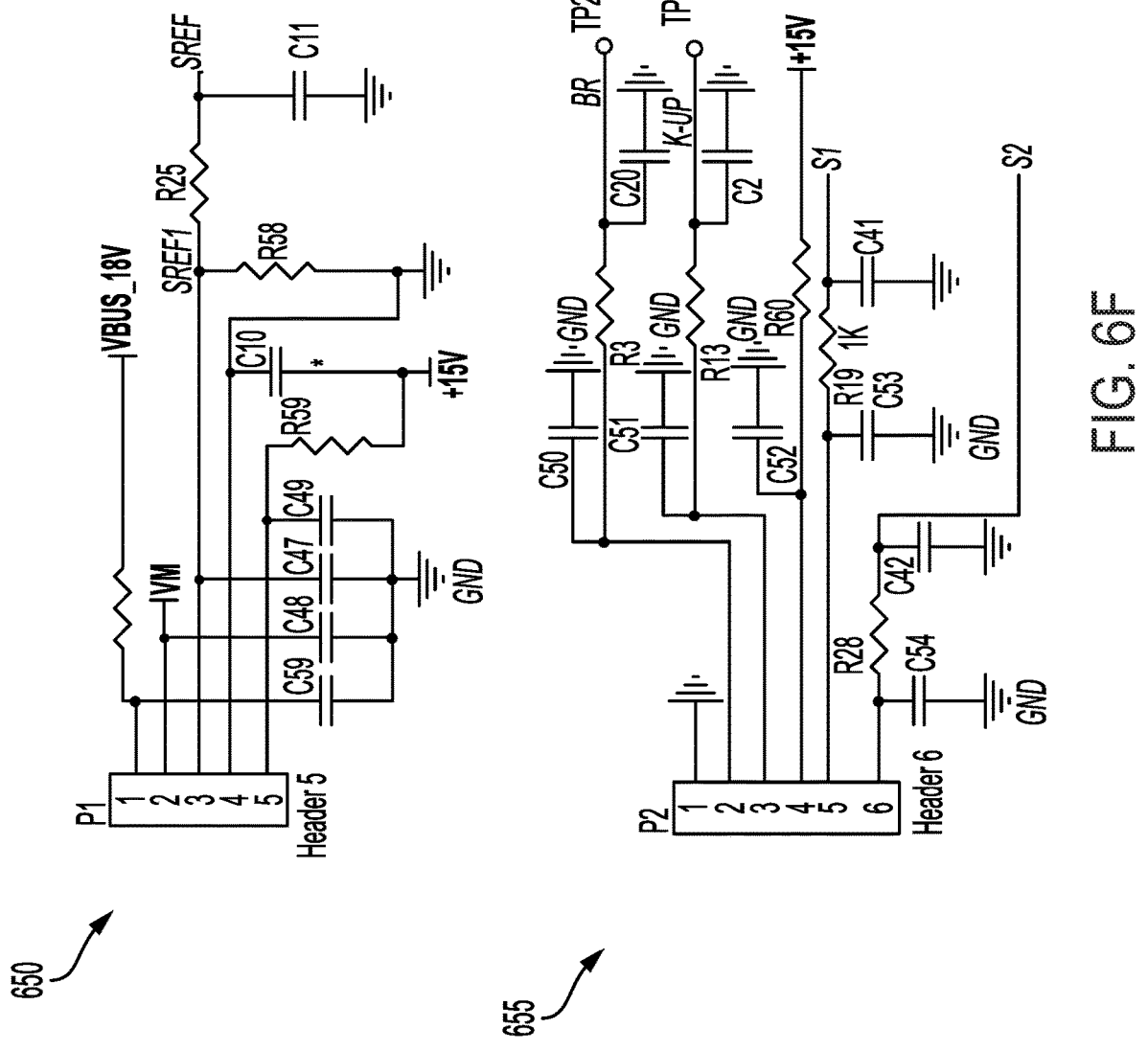
Figure 6G:
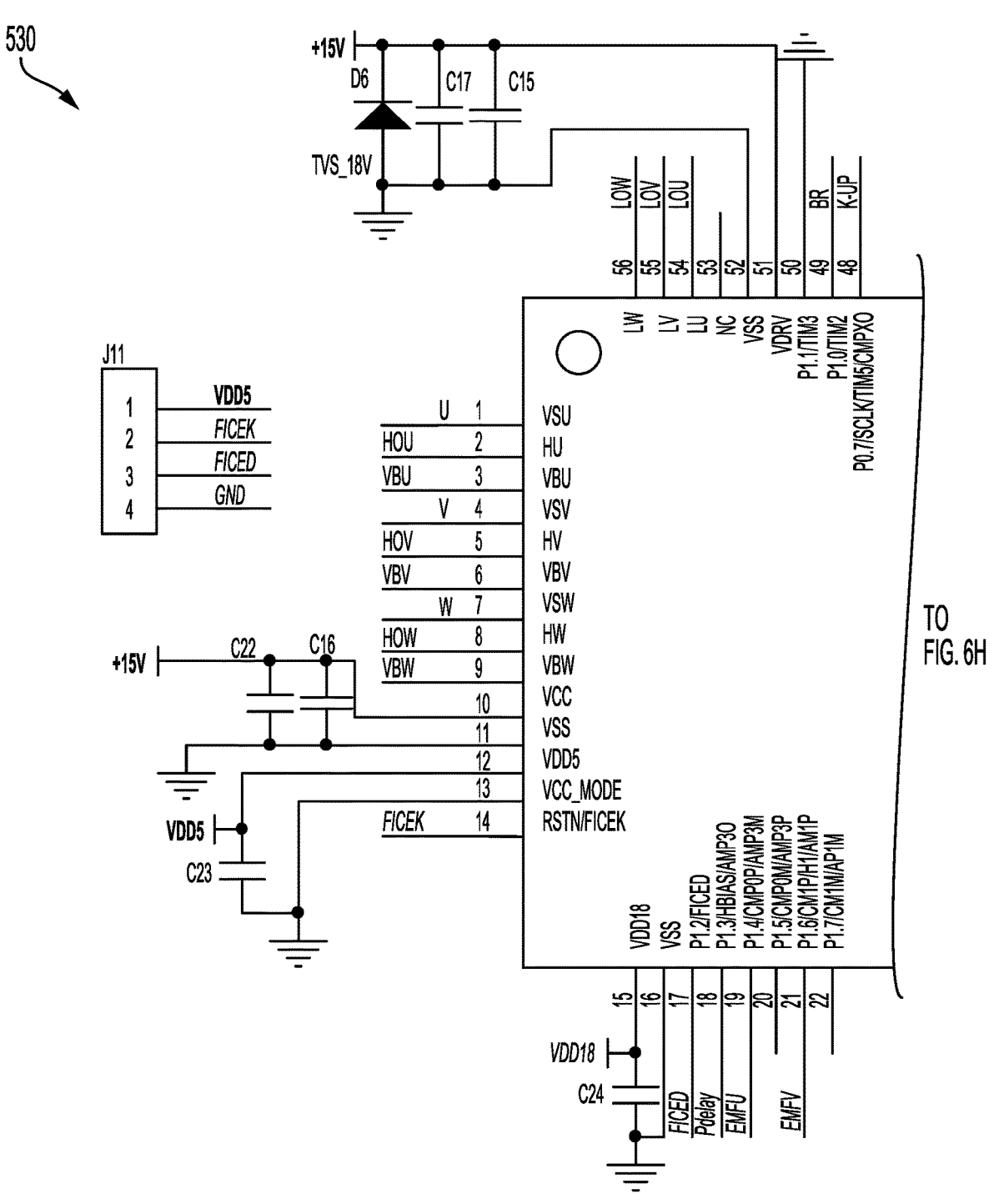
Figure 6H:
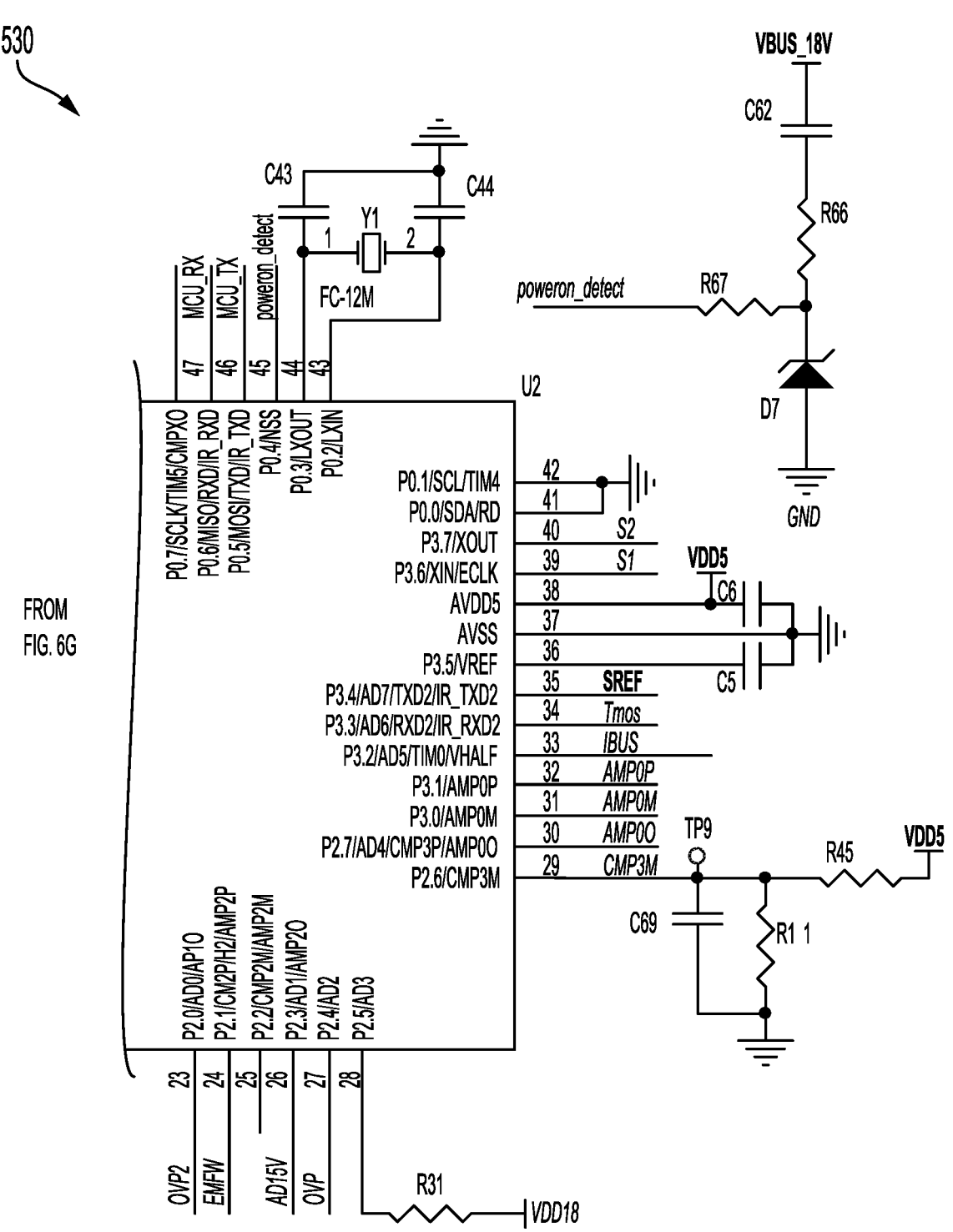
Figure 61:
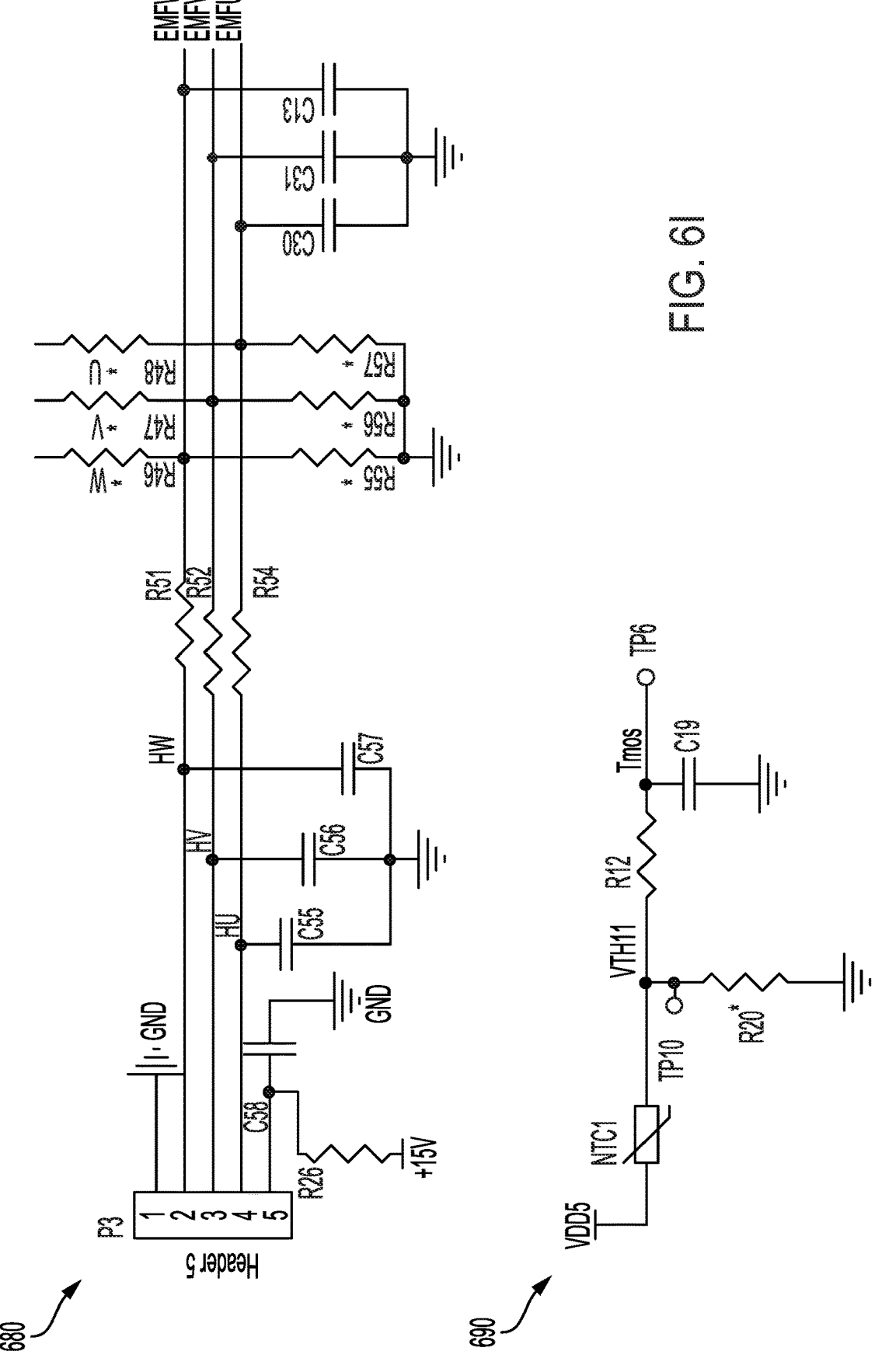

FIG. 5 illustrates examples of circuits that may be included in the portable device 100. In some examples, the circuits of FIG. 5 are included in or correspond to the multi-battery management device 110 of FIG. 1.

The circuits of FIG. 5 may include a first drive circuit 510, a second drive circuit 520, and a microcontroller (MCU) 530. FIG. 5 also depicts an illustrative, non-limiting example of a comparison circuit 540 (e.g., the comparison circuit 114). In some examples, the first drive circuit 510, the second drive circuit 520, the MCU 530, and the comparison circuit 540 are included in or correspond to the multi-battery management device 110 of FIG. 1. The circuits of FIG. 5 may also include a first MCU write-into-port circuit 560, a MCU power supply circuit 570, and a second MCU write-into-port circuit 580.

In one example, the comparison circuit 540 includes a connection W1 to a first terminal (e.g., a positive terminal) of the first battery 132 and further includes a connection W5 to a second terminal (e.g., a negative or ground terminal) of the first battery 132. The comparison circuit 540 may further include a connection W2 to a first terminal (e.g., a positive terminal) of the second battery 134 and may further include a connection W6 to a second terminal (e.g., a negative or ground terminal) of the second battery 134.

In some examples, the connections W1, W2, W5, and W6 are directly coupled to the batteries 132, 134. In this case, the comparison circuit 540 is directly coupled to the batteries 132, 134 via the connections W1, W2, W5, and W6. In some other implementations, the comparison circuit 540 may be coupled to the batteries 132, 134 via the sensor interface 112 and the one or more battery sensors 136 of FIG. 1. As an illustrative example, in some implementations, the comparison circuit 540 includes a digital circuit that receives a digitized representation of the voltage levels V1, V2, via the sensor interface 112 and the one or more battery sensors 136.

The comparison circuit 540 may further include connections W3, W4 that are coupled to the one or more components 102. For example, the connections W3, W4 may be coupled to input terminals of the electric motor 104. In some examples, the connection W3 is configured to supply the current C1 to the one or more components 102 (e.g., to the electric motor 104).

In FIG. 5, the comparison circuit 540 further includes a first comparator U2A and a second comparator U2B. Further, the comparison circuit 540 may include or may be coupled to a first switch device Q8 (e.g., the first switch device 124) and a second switch device Q9 (e.g., the second switch device 126). In some implementations, each switch device Q8, Q9 includes a metal-oxide-semiconductor field-effect transistor (MOSFET), such as an enhancement-mode n-channel MOSFET, as an illustrative example. In other examples, each switch device Q8, Q9 may have a different configuration. In addition, the comparison circuit 540 may include or may be coupled to a first transient-voltage-suppression diode (TVS1) and to a second TVS diode (TVS2). In some examples, the switch devices Q8, Q9 and the TVS diodes TVS1, TVS2 correspond to or are included in the control circuit 122 of FIG. 1. In FIG. 5, the switch devices Q8, Q9 and the TVS diodes TVS1, TVS2 are coupled to a ground node GND.

In some examples, the comparison circuit 540 is coupled to the MCU 530. For example, an output of the first comparator U2A may be coupled to an input (e.g., port "2") of the MCU 530. As another example, an output of the second comparator U2B may be coupled to another input (e.g., port "5") of the MCU 530. The first comparator U2A may be configured to generate an output BAT1_FB and to provide the output BAT1_FB to the MCU 530. The second comparator U2B may be configured to generate an output BAT2_FB and to provide the output BAT2_FB to the MCU 530.

In some implementations, the MCU 530 is coupled to the drive circuits 510, 520. For example, an output (e.g., port "6") of the MCU 530 may be coupled to an input of the first drive circuit 510. As another example, another output (e.g., port "7") of the MCU 530 may be coupled to an input of the second drive circuit 520. The MCU 530 may be configured to provide a first control signal CTR_BAT_1 to the first drive circuit 510 and to provide a second control signal CTR_BAT_2 to the second drive circuit 520.

The drive circuits 510, 520 may be coupled to the switch devices Q8, Q9. For example, the first drive circuit 510 may include an output coupled to a gate terminal of the first switch device Q8. The output of the first drive circuit 510 may be configured to provide a first battery enable signal BAT1_EN to the gate terminal of the first switch device Q8. As another example, the second drive circuit 520 may include an output coupled to a gate terminal of the second switch device Q9. The output of the second drive circuit 520 may be configured to provide a second battery enable signal BAT2_EN to the gate terminal of the second switch device Q9.

During operation, the comparators U2A, U2B may compare a difference between the voltage levels V1, V2 to a reference voltage (e.g., the first threshold 116) and may compare the current C1 to a reference current (e.g., the second threshold 118). The outputs BAT1_FB, BAT2_FB may indicate results of the comparisons performed by the comparators U2A, U2B. For example, the outputs BAT1_FB, BAT2_FB may indicate whether a first difference (V1−V2) satisfies the first threshold 116, whether a second difference (V2−V1) satisfies the first threshold 116, and whether the current C1 satisfies the second threshold 118.

For example, the first output BAT1_FB may have one of a first value or a second value. The first value may indicate that a first difference (e.g., V1−V2) satisfies the first threshold 116 and may further indicate that the magnitude of the current C1 fails to satisfy the second threshold 118. The second value may indicate that the first difference (e.g., V1−V2) fails to satisfy the first threshold 116, that the magnitude of the current C1 satisfies the second threshold 118, or both. The first value may be associated with a single-battery mode that uses the first battery 132. The second value may be associated with a multi-battery mode that uses the batteries 132, 134.

As another example, the second output BAT2_FB may have one of a third value or a fourth value. The third value may indicate that a second difference (e.g., V2−V1) satisfies the first threshold 116 and may further indicate that the magnitude of the current C1 fails to satisfy the second threshold 118. The fourth value may indicate that the second difference (e.g., V2−V1) fails to satisfy the first threshold 116, that the magnitude of the current C1 satisfies the second threshold 118, or both. The third value may be associated with a single-battery mode that uses the second battery 134. The fourth value may be associated with a multi-battery mode that uses the batteries 132, 134.

In response to the outputs BAT1_FB, BAT2_FB, the MCU 530 may select an operating mode of the multi-battery power source 130 of FIG. 1. For example, the MCU 530 may select a single-battery mode or a multi-battery mode of operation using any technique described herein. The MCU 530 may generate particular values of the control signals CTR_BAT_1, CTR_BAT_2 based on the selected operating mode of the multi-battery power source 130 of FIG. 1.

In response the control signals CTR_BAT_1, CTR_BAT_2, the drive circuits 510, 520 may selectively activate or deactivate the switch devices Q8, Q9. For example, based on a value of the first control signal CTR_BAT_1, the first drive circuit 510 may activate or deactivate the first switch device Q8. Activating the first switch device Q8 may couple the first battery 132 to the one or more components 102, and deactivating the first switch device Q8 may decouple the first battery 132 from the one or more components 102 (e.g., by disconnecting a negative battery terminal of the first battery 132 from the ground node GND).

As another example, based on a value of the second control signal CTR_BAT_2, the second drive circuit 520 may activate or deactivate the second switch device Q9. Activating the second switch device Q9 may couple the second battery 134 to the one or more components 102, and deactivating the second switch device Q9 may decouple the second battery 134 from the one or more components 102 (e.g., by disconnecting a negative battery terminal of the second battery 134 from the ground node GND).

One or more aspects of FIG. 5 enable selection among a single-battery mode of operation of the portable device 100 and a multi-battery mode of operation of the portable device 100. As a result, power provided to the one or more components 102 can be selectively increased without involving redesign of certain high-voltage components (as in the case of some series-coupled battery designs) while reducing or avoiding instances of battery-to-battery charging (as in the case of some conventional parallel-configured battery designs).

FIGS. 6A-6I illustrate examples of circuits that may be included in the portable device 100. In FIGS. 6A-6I, the circuits include a PM circuit 610, a bootstrap circuit 620, a driver circuit 630, 15 V circuitry 640, and a switch 650. In some examples, the switch 650 can be used to implement the first switch device 124, the second switch device 126, or both. The circuits of FIGS. 6A-6I further include a light-emitting diode (LED) port 655. In some examples, the LED port 655 is included in a user interface or in a status light device of the portable device 100.

The circuits of FIGS. 6A-6I further include a particular non-limiting example of the MCU 530. The circuits of FIGS. 6A-6I further include a hall effect or back electromotive force (hall/BEMF) circuit 680 and a temperature sensor circuit, such as a negative temperature coefficient (NTC) circuit 690.

Figure 7A:
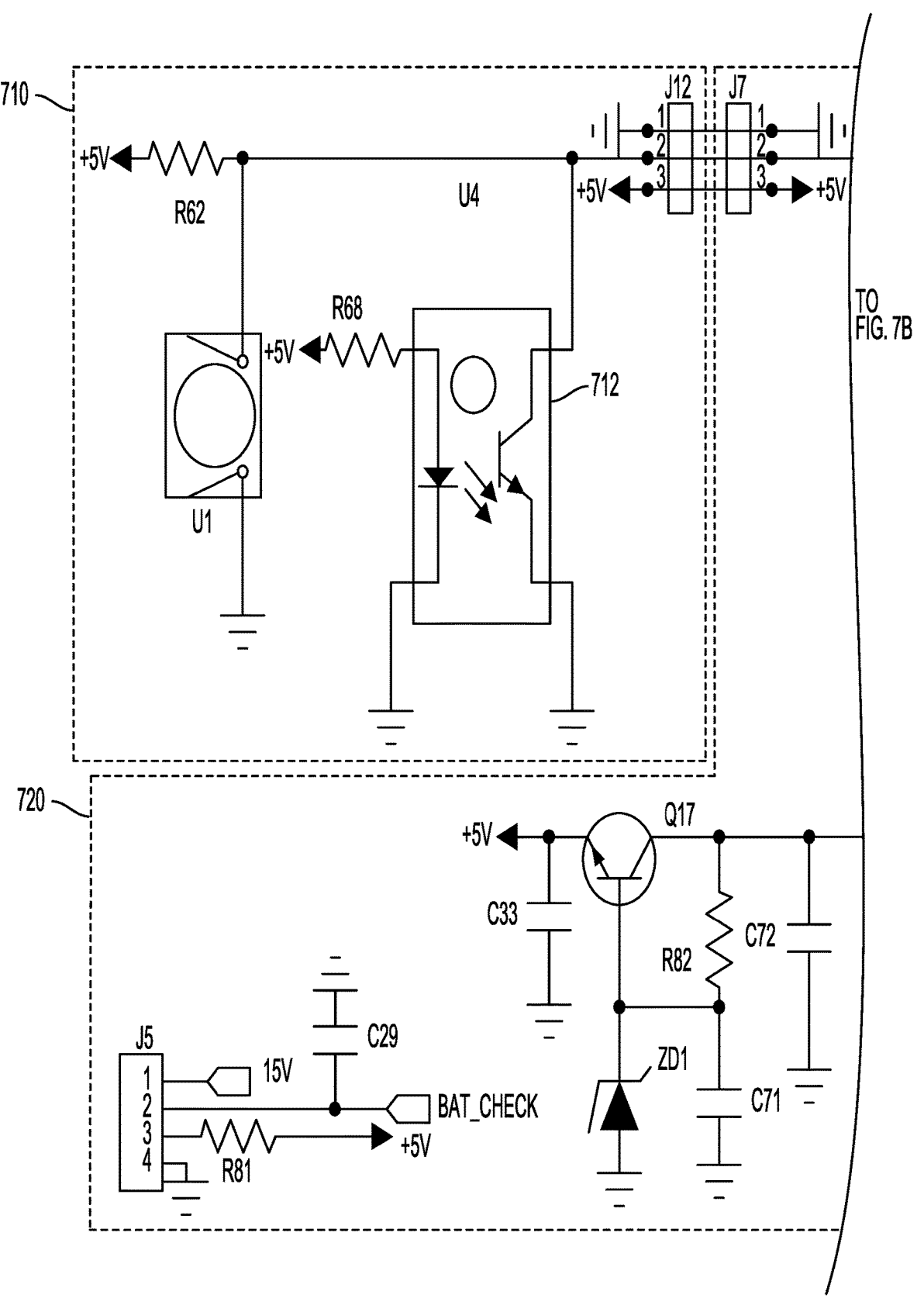
FIGS. 7A and 7B show examples of devices that may be included in a portable device, such as the portable device of FIG. 1, in accordance with some aspects of the disclosure.
Figure 7B:
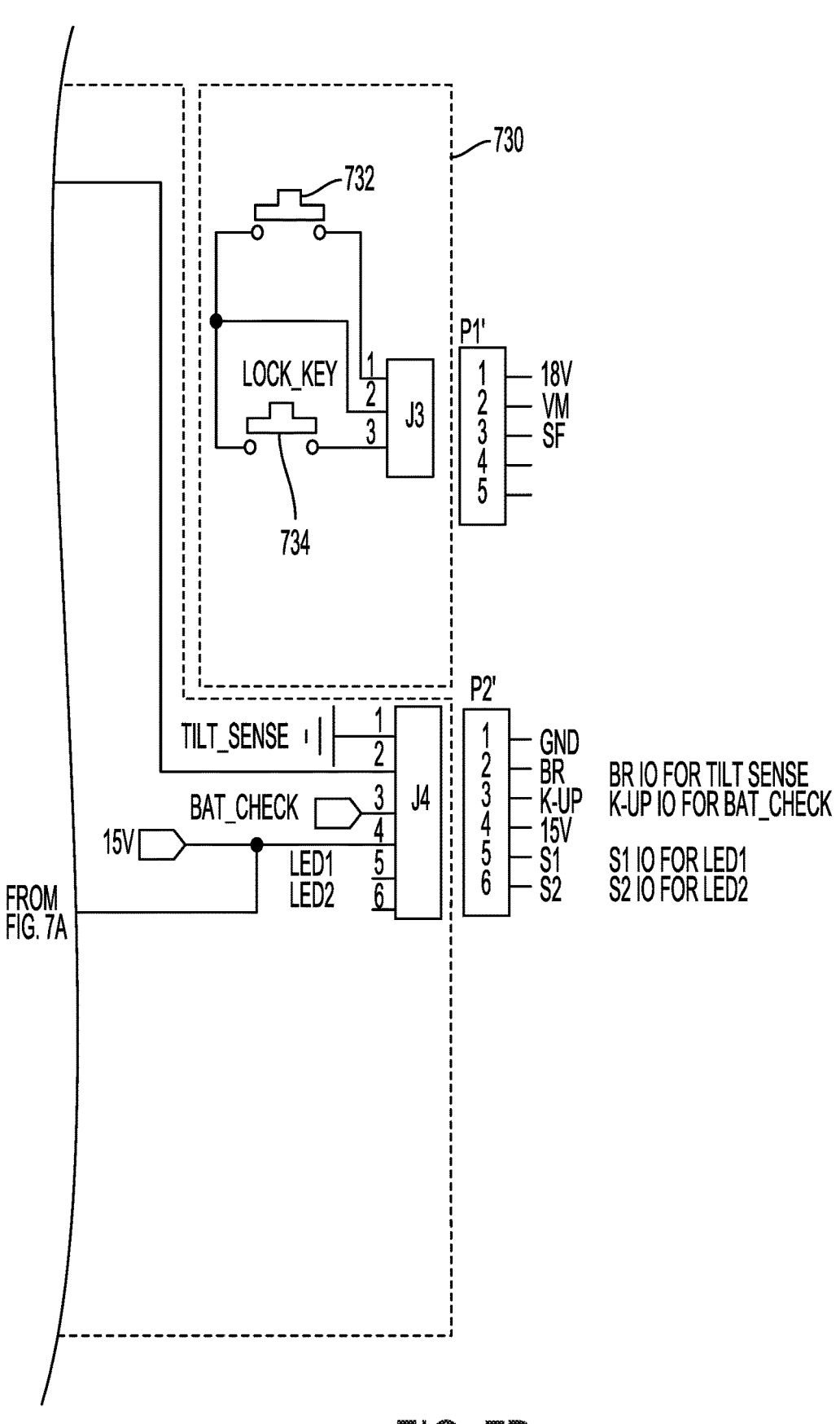

FIGS. 7A and 7B illustrate examples of devices that may be included in the portable device 100. The devices of FIGS. 7A and 7B include a tilt printed circuit board assembly (PCBA) 710. The tilt PCBA 710 includes a tilt sensor 712 configured to generate an indication ("tilt sense") of an orientation (e.g., a tilt) of the portable device 100. In one example, the tilt sensor 712 includes a photo-coupler device.

The devices of FIGS. 7A and 7B further include an LED PCBA 720. The LED PCBA 720 may be configured to generate an indication ("bat_check") of a battery status associated with the multi-battery power source 130. The indication of the battery status may be used to alert a user to recharge the portable device 100.

The devices of FIGS. 7A and 7B further include a handle key 730. The handle key 730 may be configured to activate or deactivate the portable device 100. For example, an on/off key 732 may selectively power-on or power-off the portable device 100. A lock key 734 may selectively lock the portable device 100 in the power-off mode. In some examples, one or both of the on/off key 732 or the lock key 734 are included in the power-up switch 106 of FIG. 1.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Moreover, the scope of the present application is not intended to be limited to the particular embodiments of the process, machine, manufacture, composition of matter, means, methods and steps described in the specification.

What is claimed is:

1. A method of battery management, the method comprising:
   detecting a battery management trigger event at a portable device that includes one or more components and a multi-battery power source to provide a current to the one or more components, wherein the multi-battery power source includes a first battery and at least a second battery that is coupled in parallel to the first battery;
   in response to detecting the battery management trigger event, determining a first voltage level of the first battery and a second voltage level of the second battery;
   based on a difference between the first voltage level of the first battery and the second voltage level of the second battery being greater than or equal to a first threshold and a magnitude of the current failing to be greater than or equal to a second threshold, disconnecting one of the first battery or the second battery from the one or more components and powering the one or more components of the portable device using the other of the first battery or the second battery; and
   based on the magnitude of the current being greater than or equal to the second threshold, powering the one or more components of the portable device using the first battery and the second battery.

2. The method of claim 1, wherein the portable device includes an electric mower or an electric blower, and wherein the one or more components include an electric motor.

3. The method of claim 1, further comprising receiving, from one or more battery sensors of the portable device, a first indication of the first voltage level, a second indication of the second voltage level, and a third indication of the current.

4. The method of claim 1, further comprising selecting the first battery for disconnection based on the first voltage level being less than the second voltage level.

5. The method of claim 4, wherein detecting the battery management trigger event includes detecting a power-up event at the portable device.

6. The method of claim 1, wherein the first battery is coupled to the one or more components via a first switch device, wherein the second battery is coupled to the one or more components via a second switch device.

7. The method of claim 6, wherein disconnecting the first battery or the second battery from the one or more components includes providing a control signal having a particular value to the first switch device or to the second switch device.

8. A multi-battery management device comprising:
   a comparison circuit configured to determine whether a difference between a first voltage level of a first battery and a second voltage level of a second battery is greater than or equal to a first threshold and to determine whether a magnitude of a current is greater than or equal to a second threshold, wherein the first battery and the second battery are included in a multi-battery power source of a portable device, and wherein the multi-battery power source is configured to provide the current to one or more components of the portable device; and a control circuit coupled to the comparison circuit, wherein the control circuit is configured, based on the difference between the first voltage level of the first battery and the second voltage level of the second battery being greater than or equal to the first threshold and the magnitude of the current failing to be greater than or equal to the second threshold, to disconnect one of the first battery or the second battery from the one or more components and to connect the other of the first battery or the second battery to the one or more components, and wherein the control circuit is further configured, based on the magnitude of the current being greater than or equal to the second threshold, to couple the first battery and the second battery to the one or more components.

9. The multi-battery management device of claim 8, further comprising a sensor interface coupled to the comparison circuit and configured to receive, from one sensor of the portable device, a first indication of the first voltage level of the first battery, a second indication of the second voltage level of the second battery, and a third indication of the current.

10. The multi-battery management device of claim 8, wherein the control circuit is further configured to disconnect the first battery from the one or more components based on the first voltage level being less than the second voltage level.

11. The multi-battery management device of claim 8, wherein the control circuit includes:

a first switch device coupled to the first battery and configured to selectively couple the first battery to the one or more components; and a second switch device coupled to the second battery and configured to selectively couple the second battery to the one or more components.

12. The multi-battery management device of claim 8, wherein the control circuit is further configured to detect a battery management trigger event and to selectively couple the first battery and the second battery to the one or more components in response to the battery management trigger event.

13. The multi-battery management device of claim 12, wherein the battery management trigger event corresponds to a power-up event of the portable device, and further comprising a power-up switch device configured to provide an indication of the power-up event to the control circuit.

14. A system comprising:

one or more sensors configured to generate a first indication of a first voltage level of a first battery of a portable device, a second indication of a second voltage level of a second battery of the portable device, and a third indication of a magnitude of a current supplied to one or more components of the portable device by the first battery and the second battery; and a multi-battery management device configured to:

detect a battery management trigger event at the portable device;

in response to detecting the battery management trigger event, determine the first voltage level of the first battery, the second voltage level of the second battery, and the magnitude of the current;

based on a difference between the first voltage level of the first battery and the second voltage level of the second battery satisfyingbeing greater than or equal to a first threshold and the magnitude of the current failing to satisfybe greater than or equal to a second threshold, disconnect one of the first battery or the second battery from the one or more components and initiate powering of the one or more components using the other of the first battery or the second battery; and based on the magnitude of the current being greater than or equal to the second threshold, initiate powering of the one or more components of the portable device using the first battery and the second battery.

15. The system of claim 14, wherein the multi-battery management device is further configured to select the first battery for disconnection based on the first voltage level being less than the second voltage level.

16. The system of claim 14, wherein the one or more components include an electric motor of the portable device.

17. The system of claim 14, further comprising:

a first switch device coupled to the first battery and configured to selectively couple the first battery to the one or more components; and a second switch device coupled to the second battery and configured to selectively coupled the second battery to the one or more components, wherein the first switch device and the second switch device are both part of the multi- battery management device.

18. The system of claim 17, wherein the multi-battery management device is further configured to provide a control signal having a particular value to the first switch device or to the second switch device to disconnect the first battery or the second battery from the one or more components.

19. The system of claim 14, wherein the multi-battery management device is further configured to detect a battery management trigger event and to selectively couple the first battery and the second battery to the one or more components in response to the battery management trigger event.

20. The system of claim 19, wherein the battery management trigger event corresponds to a power-up event of the portable device, and further comprising a power-up switch device configured to generate an indication of the power-up event, and wherein the battery management trigger event further comprises expiration of a counter.

* * * * *